(12) United States Patent
Kim et al.

(10) Patent No.: US 11,631,807 B2
(45) Date of Patent: Apr. 18, 2023

(54) PATTERNED SILICIDE STRUCTURES AND METHODS OF MANUFACTURE

(71) Applicant: Integrated Silicon Solution, (Cayman) Inc., Grand Cayman (KY)

(72) Inventors: Kuk-Hwan Kim, Fremont, CA (US); Dafna Beery, Fremont, CA (US); Marcin Gajek, Berkeley, CA (US); Michail Tzoufras, Sunnyvale, CA (US); Kadriye Deniz Bozdag, Sunnyvale, CA (US); Eric Ryan, Fremont, CA (US); Satoru Araki, San Jose, CA (US); Andy Walker, Fremont, CA (US)

(73) Assignee: Integrated Silicon Solution, (Cayman) Inc., Grand Cayman (KY)

( * ) Notice: Subject to any disclaimer, the term of this patent is extended or adjusted under 35 U.S.C. 154(b) by 0 days.

(21) Appl. No.: 17/403,753

(22) Filed: Aug. 16, 2021

(65) Prior Publication Data
US 2022/0029092 A1 Jan. 27, 2022

Related U.S. Application Data

(62) Division of application No. 16/236,275, filed on Dec. 28, 2018, now Pat. No. 11,107,979.

(51) Int. Cl.
*H01L 43/12* (2006.01)
*H01L 27/22* (2006.01)
(Continued)

(52) U.S. Cl.
CPC ........ *H01L 43/12* (2013.01); *H01L 21/02164* (2013.01); *H01L 21/28518* (2013.01);
(Continued)

(58) Field of Classification Search
CPC ................. H01L 43/08; H01L 21/3081; H01L 29/66666; H01L 21/28518; H01L 27/222; H01L 29/7827; H01L 29/41741; H01L 27/228; H01L 21/02164; H01L 43/02; H01L 43/10; H01L 21/02697; H01L 21/28525; H01L 43/12; H01L 21/02271; H01L 21/324; H01L 45/16;
(Continued)

(56) References Cited

U.S. PATENT DOCUMENTS

2007/0279978 A1* 12/2007 Ho ................... G11C 11/16
257/E27.005
2010/0052029 A1* 3/2010 Huang .............. H01L 27/10876
257/E27.084

(Continued)

*Primary Examiner* — Mouloucoulaye Inoussa

(57) ABSTRACT

Aspects of the present technology are directed toward Integrated Circuits (IC) including a plurality of trenches disposed in a substrate about a set of silicide regions. The trenches can extend down into the substrate below the set of silicide regions. The silicide regions can be formed by implanting metal ions into portions of a substrate exposed by a mask layer with narrow pitch openings. The trenches can be formed by selectively etching the substrate utilizing the set of silicide regions as a trench mask. An semiconductor material with various degree of crystallinity can be grown from the silicide regions, in openings that extend through subsequently formed layers down to the silicide regions.

20 Claims, 33 Drawing Sheets

(51) Int. Cl.
   *H01L 43/02*   (2006.01)
   *H01L 21/285*  (2006.01)
   *H01L 21/02*   (2006.01)
   *H01L 21/308*  (2006.01)
   *H01L 43/08*   (2006.01)
   *H01L 43/10*   (2006.01)
   *H01L 21/324*  (2006.01)

(52) U.S. Cl.
   CPC .... *H01L 21/28525* (2013.01); *H01L 21/3081* (2013.01); *H01L 27/222* (2013.01); *H01L 43/02* (2013.01); *H01L 43/08* (2013.01); *H01L 43/10* (2013.01); *H01L 21/02271* (2013.01); *H01L 21/324* (2013.01)

(58) Field of Classification Search
   CPC ............ H01L 27/2445; H01L 27/2427; H01L 45/126; H01L 45/1233; H01L 45/1293; H01L 45/06; H01L 27/2481; H01L 45/1675; H01L 27/1026; H01L 45/144; H01L 27/2454; H01L 45/141; H01L 45/145; H01L 45/1608; H01L 27/249; H01L 45/08; H01L 45/146; H01L 45/04; H01L 21/76816; H01L 27/11573; H01L 27/224; H01L 21/76804; G11C 13/0004; G11C 13/0023; G11C 13/004; G11C 13/0069; G11C 13/0097; G11C 13/0007
   USPC .. 257/2, 4, 5, 329, 306, 309, 565, 588, 324, 257/334, 302, 532, 300, E29.174, 257/E27.084, E21.001, E47.001, E21.657, 257/E21.655, E21.649, E21.415, E29.274, 257/E29.275; 438/102, 369, 366, 309, 438/382, 128, 287, 270, 258, 268
   See application file for complete search history.

(56) References Cited

U.S. PATENT DOCUMENTS

| | | | |
|---|---|---|---|
| 2010/0238711 A1* | 9/2010 | Asao | G11C 11/16 365/148 |
| 2010/0270529 A1* | 10/2010 | Lung | H01L 45/1683 257/E47.001 |
| 2010/0295009 A1* | 11/2010 | Lung | H01L 27/2463 257/E47.001 |
| 2010/0295123 A1* | 11/2010 | Lung | H01L 27/2463 257/334 |
| 2011/0017971 A1* | 1/2011 | Kim | H01L 27/24 257/329 |
| 2012/0018845 A1* | 1/2012 | Lung | H01L 45/1625 257/E29.174 |
| 2014/0061745 A1* | 3/2014 | Myung | H01L 21/76879 257/532 |
| 2014/0198553 A1* | 7/2014 | Lung | G11C 11/5678 365/63 |
| 2016/0104745 A1* | 4/2016 | Park | H01L 43/10 257/421 |
| 2018/0212140 A1* | 7/2018 | Noh | H01L 27/222 |
| 2018/0342669 A1* | 11/2018 | Kim | H01L 43/12 |
| 2018/0350875 A1* | 12/2018 | Han | H01L 23/53295 |

* cited by examiner

PATTERNED SILICIDE STRUCTURES AND METHODS OF MANUFACTURE

CROSS-REFERENCE TO RELATED APPLICATIONS

This is a divisional of U.S. patent application Ser. No. 16/236,275 filed Dec. 28, 2018, now U.S. Pat. No. 11,107,979, issued Aug. 31, 2021, which is incorporated herein in its entirety.

BACKGROUND OF THE INVENTION

Computing systems have made significant contributions toward the advancement of modern society and are utilized in a number of applications to achieve advantageous results. Numerous devices, such as desktop personal computers (PCs), laptop PCs, tablet PCs, netbooks, smart phones, game consoles, servers, distributed computing systems, and the like have facilitated increased productivity and reduced costs in communicating and analyzing data in most areas of entertainment, education, business, and science. One common aspect of computing systems is the computing device readable memory. Computing devices may include one or more types of memory, such as volatile random-access memory, non-volatile flash memory, and the like.

An emerging non-volatile memory technology is Magnetoresistive Random Access Memory (MRAM). MRAM devices are characterized by densities similar to Dynamic Random-Access Memory (DRAM), power consumption similar to flash memory, and speed similar to Static Random-Access Memory (SRAM). Although MRAM devices exhibit favorable performance characteristics as compared to other memory technologies, there is a continuing need for improved MRAM devices and methods of manufacture thereof. The reduction of the minimum feature size of structures in the device is commonly utilized to increase the densities of MRAM and other similar devices. However, undesirable characteristics and affects can occur as the feature size of structures are continually reduced. One such instance can occur with the reduction in the feature size of silicide regions.

Referring to FIG. 1, an exemplary array of selectors, in accordance with the conventional art, is shown. The array of selectors can include a control gate formed by a conductive layer 105 such as polysilicon sandwiched between a first and second dielectric layers 110, 115. A set of openings can extend through the first and second dielectric layers 110, 115 and the conductive layer 105, and down to a set of buried doped regions 120 in a substrate 125. A third dielectric layer 130 can be disposed on the wall of the plurality of openings, and a layer of silicon 135 can fill the openings. A set of silicide regions 140 can be formed on the silicon layer 135 filling the plurality of openings. However, as the feature sizes are decreased, silicidation and post silicidation recrystallization can cause silicon void formation 145, structural deformation (e.g., surface rounding) 150, and the like. The formation of voids and or the degradation of the flatness of surfaces during the manufacture of a silicide can negatively impact the device. Accordingly, there is a continuing need for improved structures and methods of manufacturing of such ICs.

SUMMARY OF THE INVENTION

The present technology may best be understood by referring to the following description and accompanying drawings that are used to illustrate embodiments of the present technology directed toward improved patterned silicide structures and methods of manufacture.

In one embodiment, a method of forming an interconnect in an IC can include forming a set of silicide regions in portions of a substrate. The substrate can be selectively etched to form trenches into the substrate along-side the set of silicide regions and extending below the set of silicide regions. The trenches can be filled with a first dielectric layer. A second dielectric layer, a conductive layer and a third dielectric layer can be formed over the set of silicide regions and the first dielectric layer filling the trenches. The second dielectric layer, the conductive layer and the third dielectric layer can be selectively etched to form a plurality of openings substantially aligned to the set of silicide regions, wherein sets of the plurality of openings extend to corresponding ones of the silicide regions. A fourth dielectric layer can be formed on the exposed surfaces of the one or more conductive layers in the plurality of openings, and epitaxial semiconductor can be formed in the plurality of openings after formation of the fourth dielectric layer.

In another embodiment, a method of forming a Magnetic Tunnel Junction (MTJ) memory array can include forming a mask on a semiconductor substrate. The mask can include openings with a large length to width ratio used to define a set of source lines, bit lines or the like. A first set of silicide regions can be formed in portions of the semiconductor substrate exposed by the mask. The semiconductor substrate can be selectively etched to form a set of trenches into the semiconductor substrate self-aligned to the first set of silicide regions and extending below the first set of silicide regions. A nitride layer can be deposited on the walls of the trenches and a dielectric fill can be deposited in the trenches after formation of the nitride layer. A first dielectric layer can be deposited over the first set of silicide regions and the nitride and dielectric fill in the trenches. A conductive layer can be deposited over the first dielectric layer. A second dielectric layer can be deposited over the conductive layer. The second dielectric layer, the conductive layer and the third dielectric layers can be selectively etched to form a plurality of openings substantially extending to the first set of silicide regions, wherein sets of the openings extend to a corresponding ones of the silicide regions. A fourth dielectric layer can be formed on the exposes surfaces of the one or more conductive layers in the plurality of openings. A semiconductor can be epitaxially deposited in the plurality of openings after formation of the fourth dielectric layer.

In another embodiment, a method of forming a Magnetic Tunnel Junction (MTJ) memory array can include forming a first silicide region in a semiconductor substrate. A mask can then be formed on the substrate, wherein the mask includes openings with a large length to width ratio. The semiconductor substrate exposed by the mask can be etched to form a set of trenches into the semiconductor substrate and a first set of silicide regions disposed between the trenches. The trenches can extend below the first set of silicide regions. A nitride layer can be deposited on the walls of the trenches, and a dielectric fill can be deposited in the trenches after formation of the nitride layer. A first dielectric layer can be deposited over the first set of silicide regions and the nitride and dielectric fill in the trenches. A conductive layer can be deposited over the first dielectric layer. A second dielectric layer can be deposited over the conductive layer. The second dielectric layer, the conductive layer and the third dielectric layers can be selectively etched to form a plurality of openings substantially extending to the first set of silicide regions, wherein sets of the openings extend to a corresponding ones of the silicide regions. A fourth dielectric layer can be formed on the exposes surfaces of the one or more conductive layers in the plurality of openings. A semiconductor can be epitaxially deposited in the plurality of openings after formation of the fourth dielectric layer.

In yet another embodiment, an IC can include a plurality of silicide regions disposed in a substrate. A plurality of trenches can be disposed about the plurality of silicide regions and extend into the substrate below the plurality of silicide regions. A plurality of first dielectric regions can be disposed in the plurality of trenches and over the plurality of silicide regions. A plurality of first conductive regions can be disposed above the plurality of first dielectric regions. A plurality of second dielectric regions can be disposed above the plurality of conductive regions. A plurality of semiconductor material with various degree of crystallinity regions can be disposed in holes extending through the plurality of second dielectric regions, the plurality of conductive regions and the plurality of first dielectric regions and down to the plurality of silicide regions. Set of the selectors can be coupled to corresponding silicide regions. A third dielectric region can be disposed between the first conductive regions and the plurality of semiconductor material with various degree of crystallinity regions. A plurality of Magnetic Tunnel Junction (MTJ) cell pillars can be disposed on corresponding ones of the plurality of semiconductor material with various degree of crystallinity regions.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which.

DETAILED DESCRIPTION OF THE INVENTION

Figure 1:
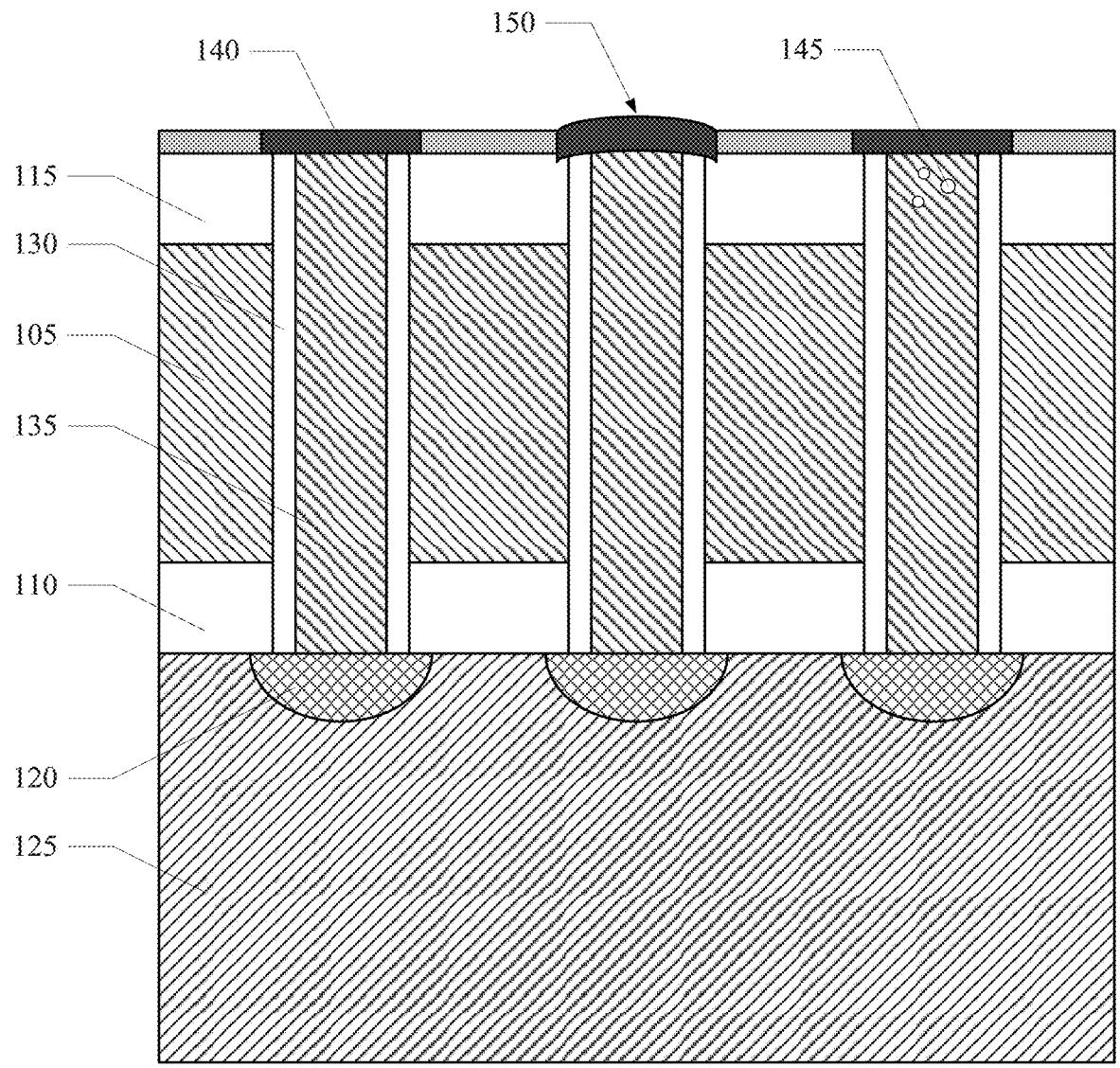
FIG. 1 shows a block diagram of an exemplary array of selectors, in accordance with the conventional art.

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. The use of the terms "first," "second," "third," and so on are not intended to indicate a particular sequence or number of elements. Instead, the terms "first," "second," "third," are utilized to differentiate between similar named elements. It is also to be understood that the phraseology and terminology used herein is for the purpose of description and should not be regarded as limiting.

Figure 2A:
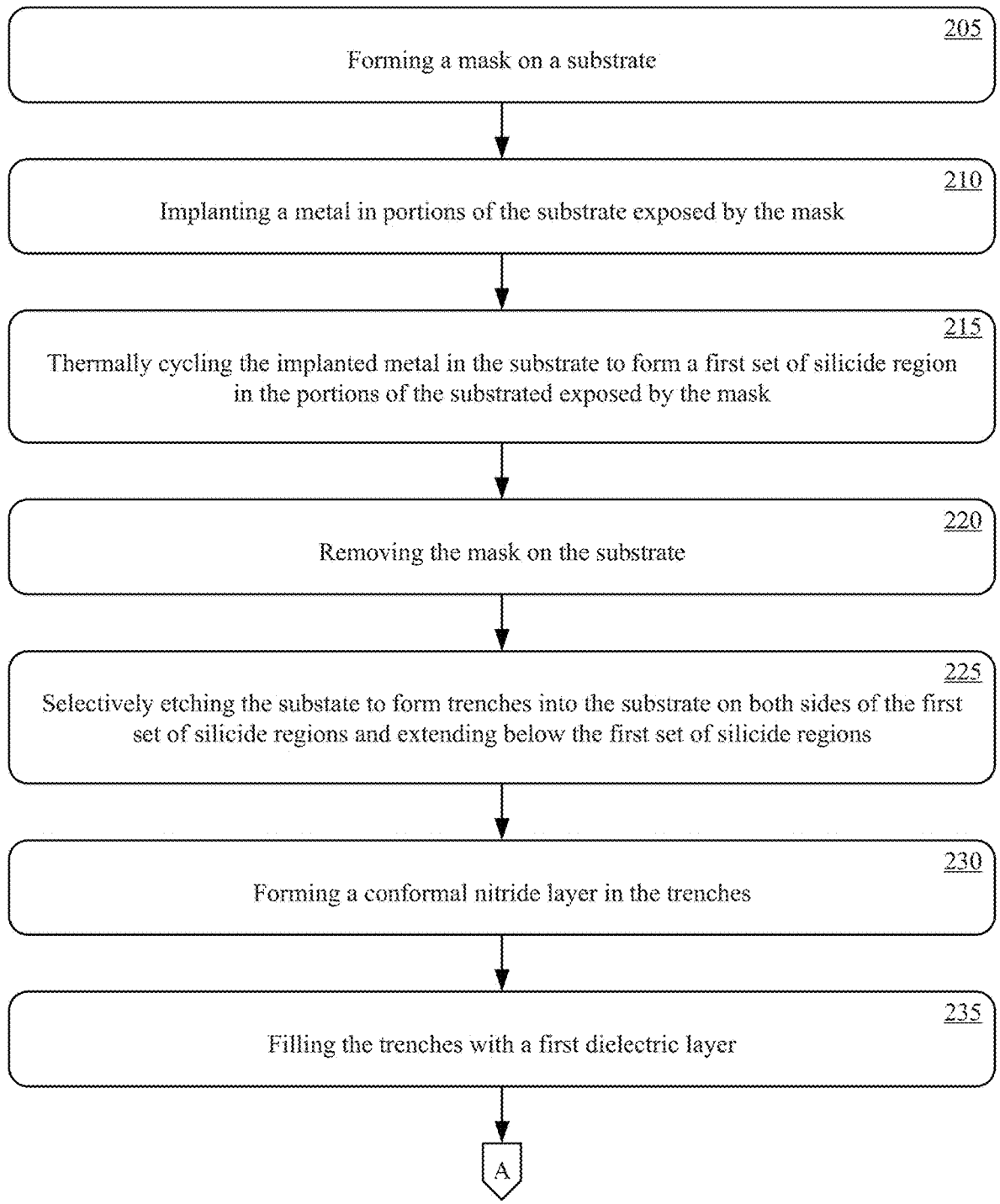
FIGS. 2A, 2B and 2C show a flow diagram of a method of manufacturing an Integrated Circuit (IC), in accordance with aspects of the present technology.
Figure 2B:
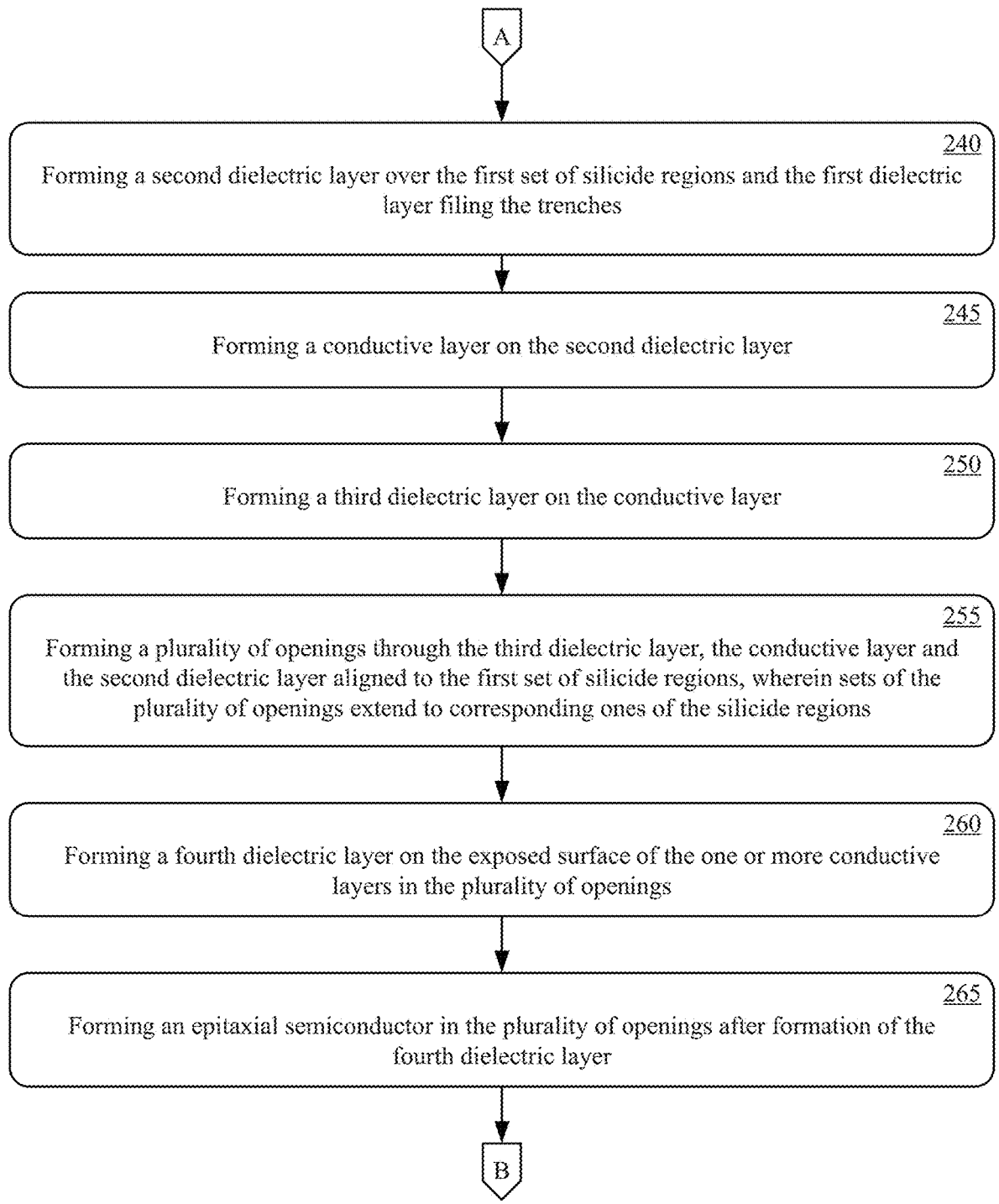
Figure 2C:
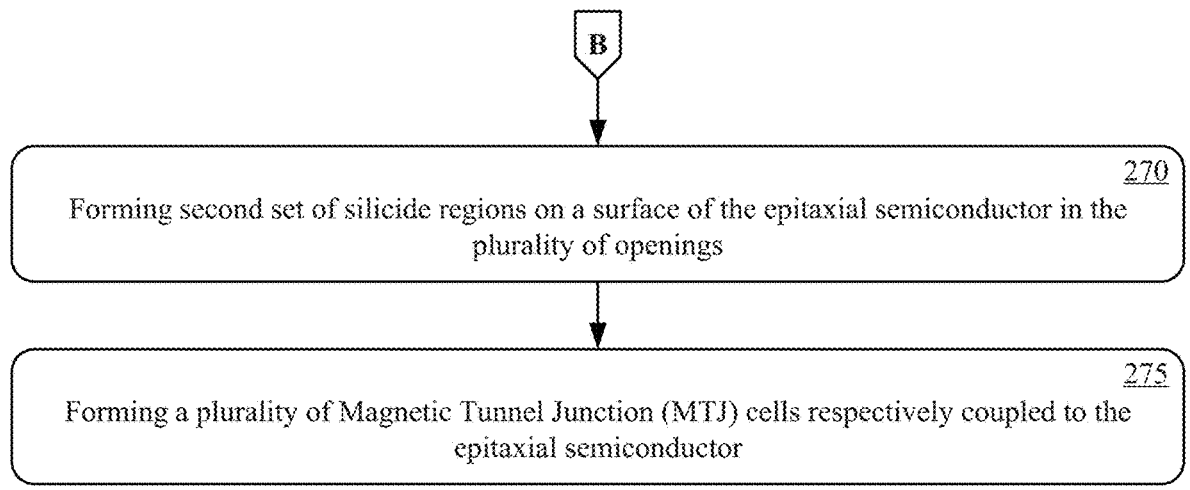

Referring now to FIGS. 2A, 2B and 2C, a method of manufacturing an Integrated Circuit (IC), in accordance with aspects of the present technology, is shown. The method of manufacturing the IC will be further explained with reference to FIGS. 3A through 3L, and FIGS. 4A through 4B, which shows partial views of the IC during manufacturing, in accordance with aspects of the present technology. The method can include forming a first set of silicide regions in portions of a substrate. In one implementation, a mask 302 can be formed on a substrate 304, at 205. The mask can be an organic or inorganic hard mask or a photoresist adapted for an implantation blocking layer. In one implementation, the substrate can be a p-doped Silicon (Si) substrate. The mask 302 can include a set of elongated openings with a tight pitch, providing a large length to width ratio characteristic. One or more metals 306 can be implanted 308 in portions of the substrate 304 exposed by the openings in the mask 302, at 210. The one or more metals 306 can include Nickel (Ni), Cobalt (Co), or Titanium (Ti). The metal can be implanted in one or more sequences, such as implanting at different acceleration energies to achieve a predetermined precipitate concentration along the depth direction. At 215, the substrate 304 including the implanted metal 306 can be thermally cycled to form a first set of silicide regions 310 in the portions of the substrate 304. One or more thermal cycles can be utilized to achieve a predetermined specific phase of the metal silicide forming the first set of silicide regions 310. An acceleration energy of the implant process can be adjusted in order to achieve different projected ranges (Rp) and/or longitudinal straggle ($\Delta Rp$). In general higher Rp needs high acceleration energy and also results in higher ($\Delta Rp$). The implanted precipitates can exist inside silicon as small silicide nucleates as metal ions penetrate through the Silicon (Si) at very high energy and readily form silicide in a localized area. By thermal cycling after implantation, horizontally scattered ion-implanted precipitates can gather together (e.g., pull each other) to form a single-phase silicide, thereby creating a high fidelity very narrow/clean line and spaced silicide pattern. In one implementation, the first set of silicide regions 310 can form at least portions of a set of source lines. At 220, the mask 302 can be removed after implanting and thermally cycling the substrate 304.

Figure 3A:
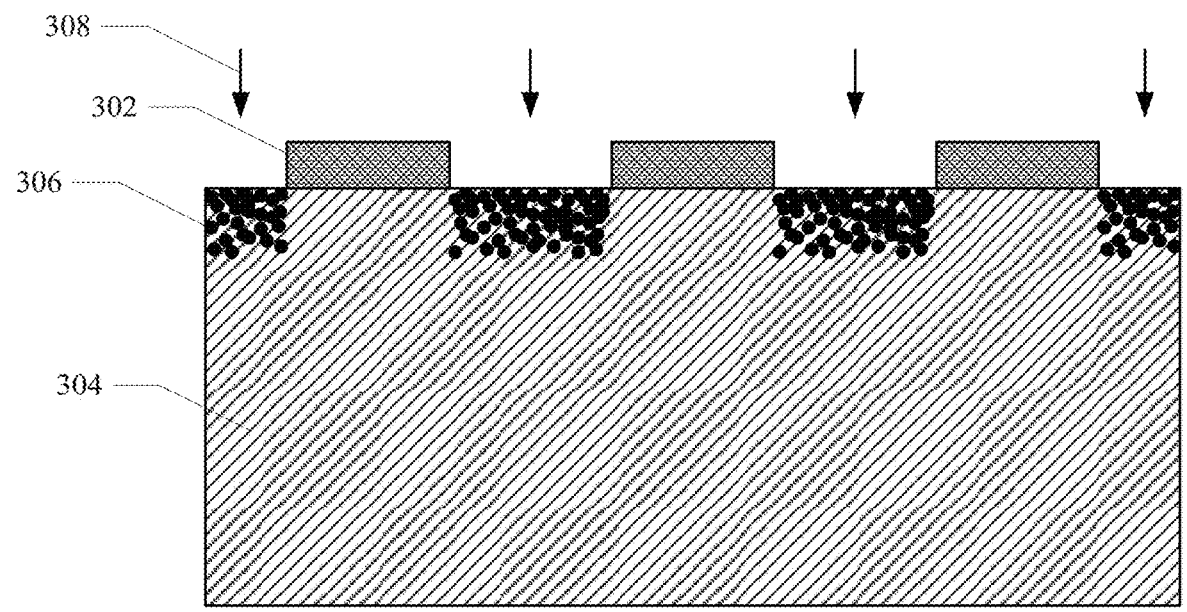
FIGS. 3A through 3L show a block diagram of partial views of an IC during manufacturing, in accordance with aspects of the present technology.
Figure 3B:
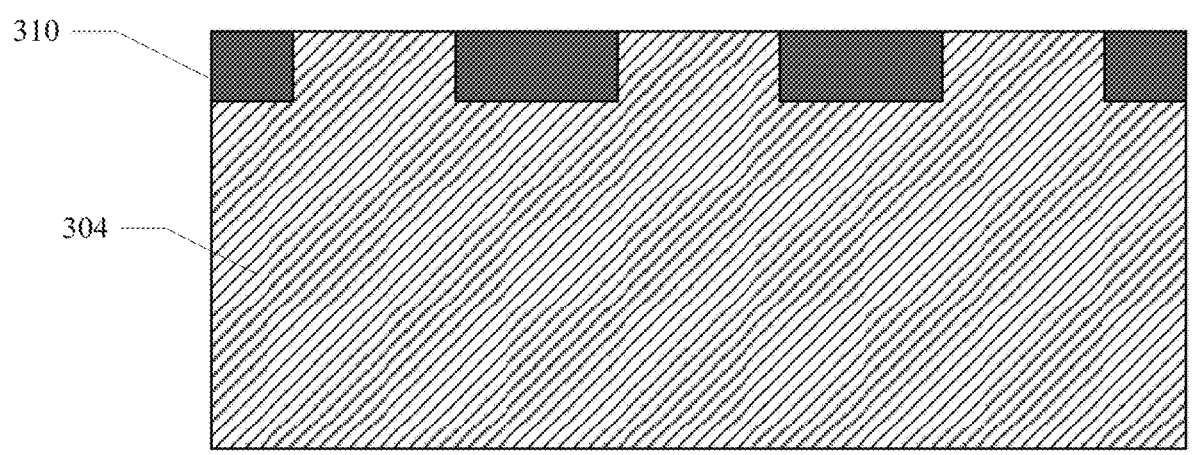
Figure 3C:
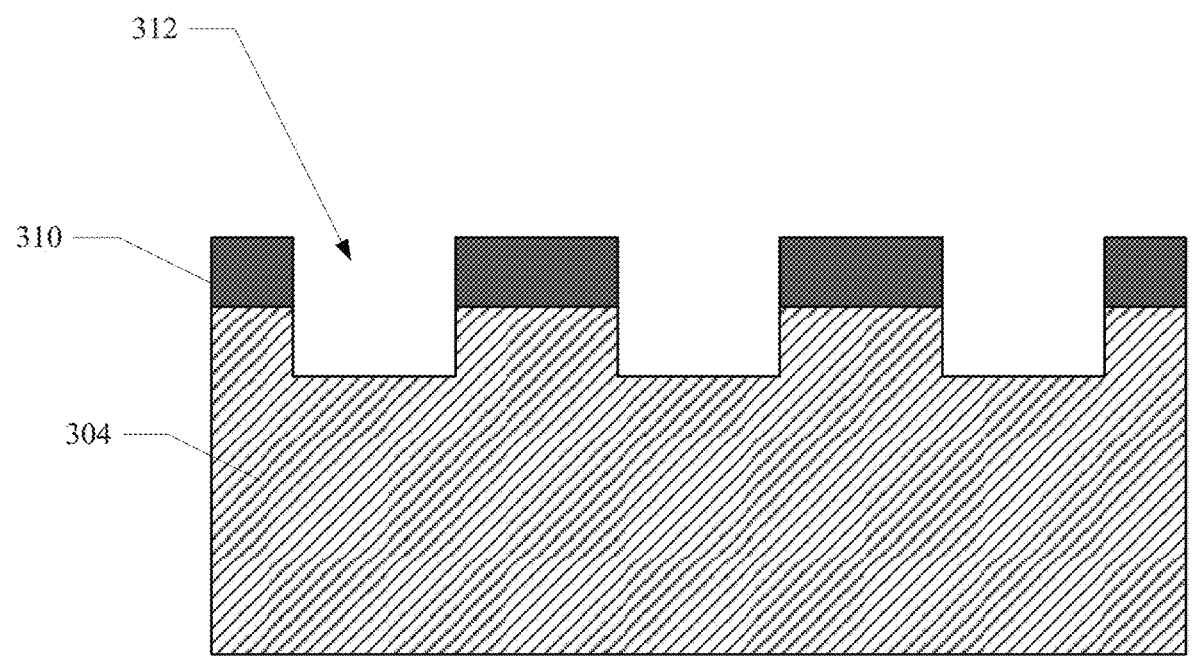
Figure 3D:
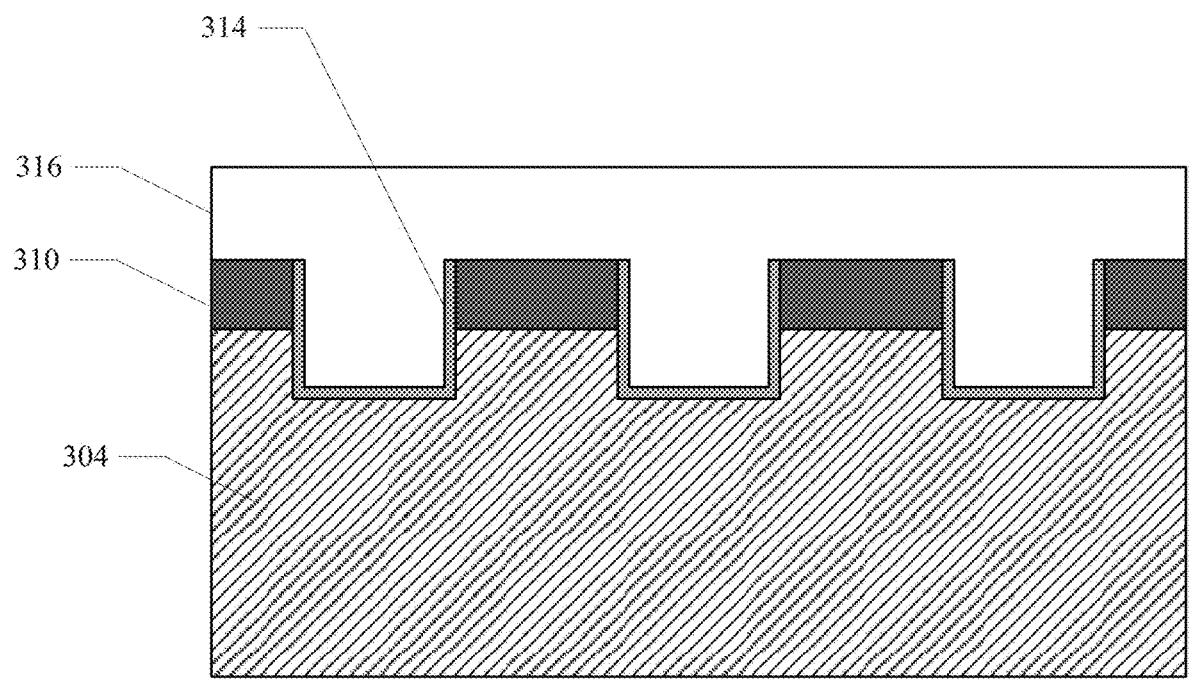
Figure 3E:
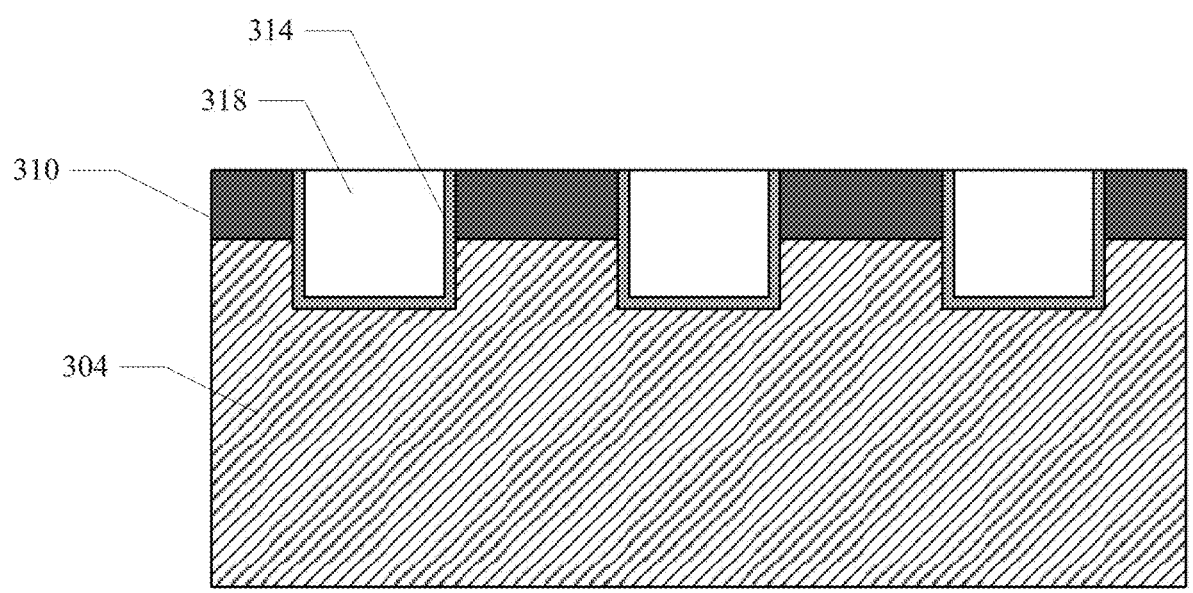
Figure 3F:
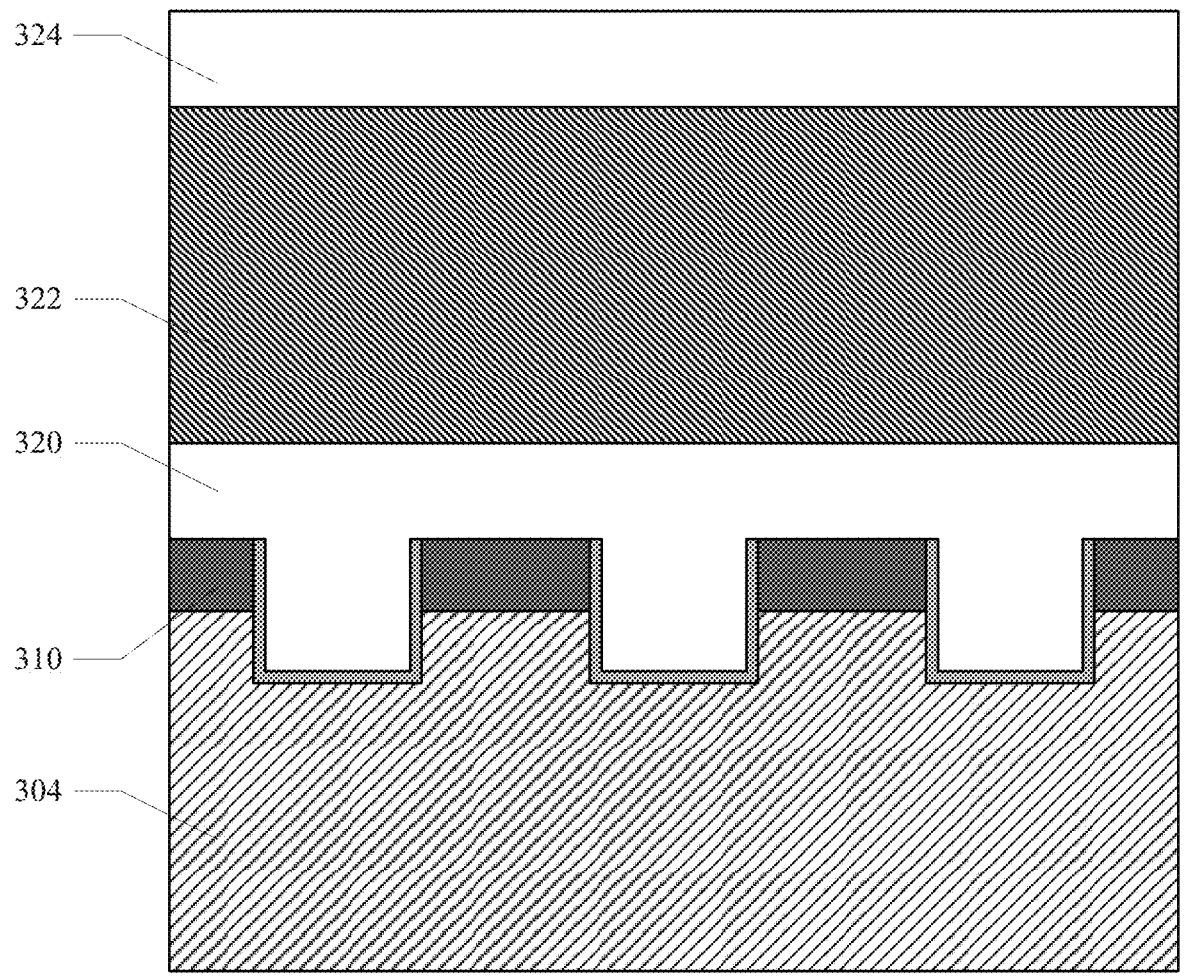
Figure 3G:
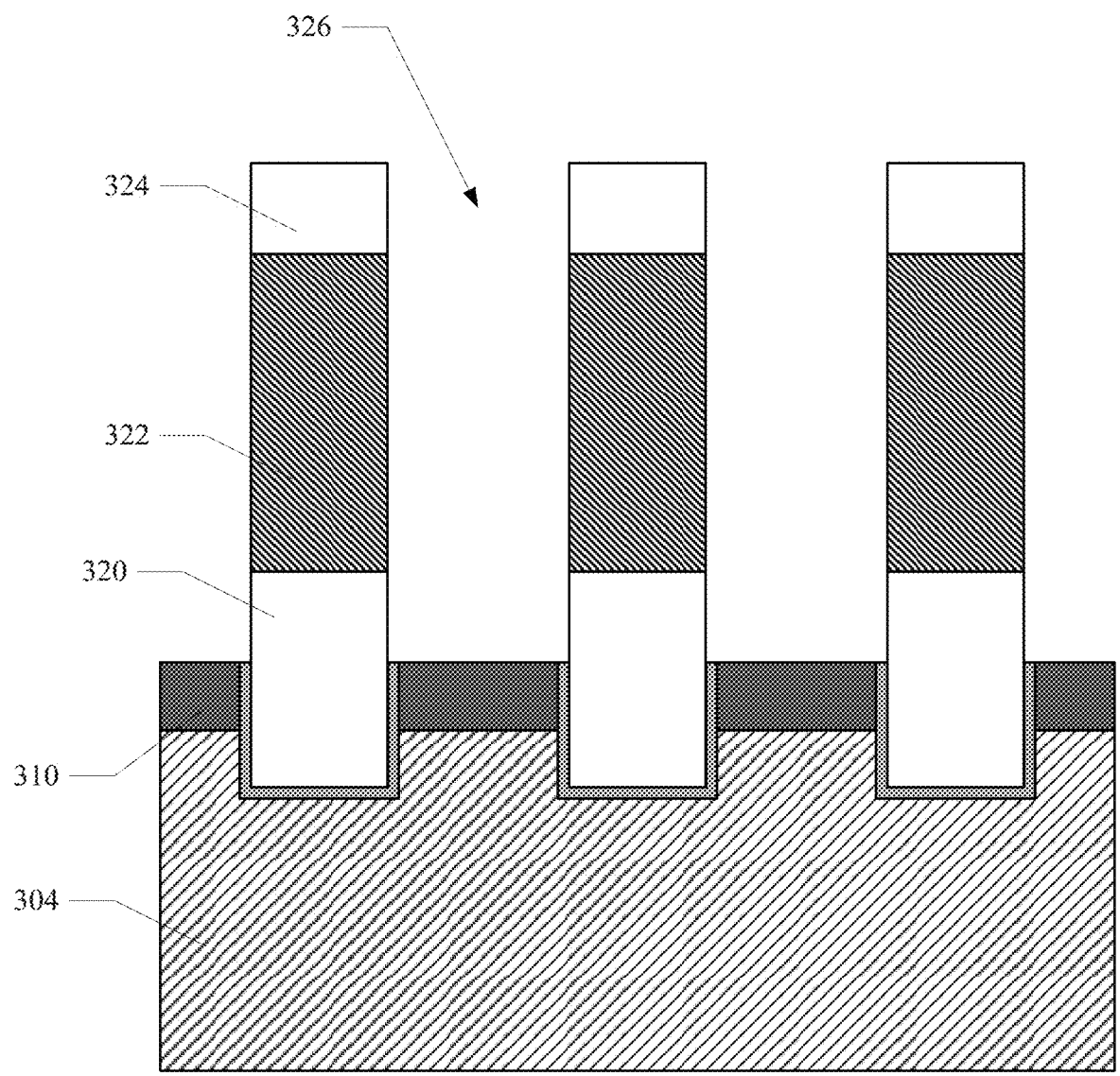
Figure 3H:
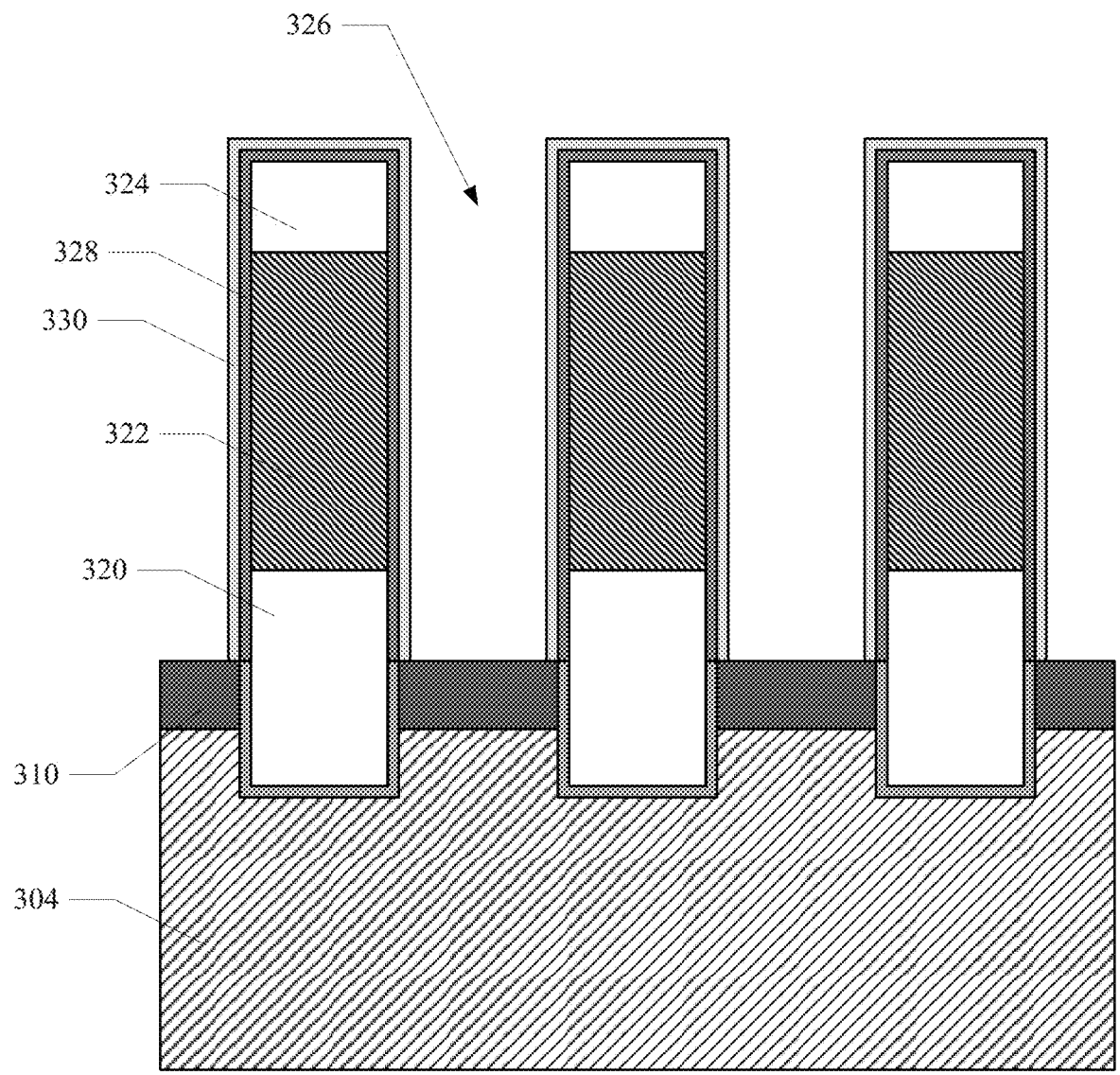
Figure 3I:
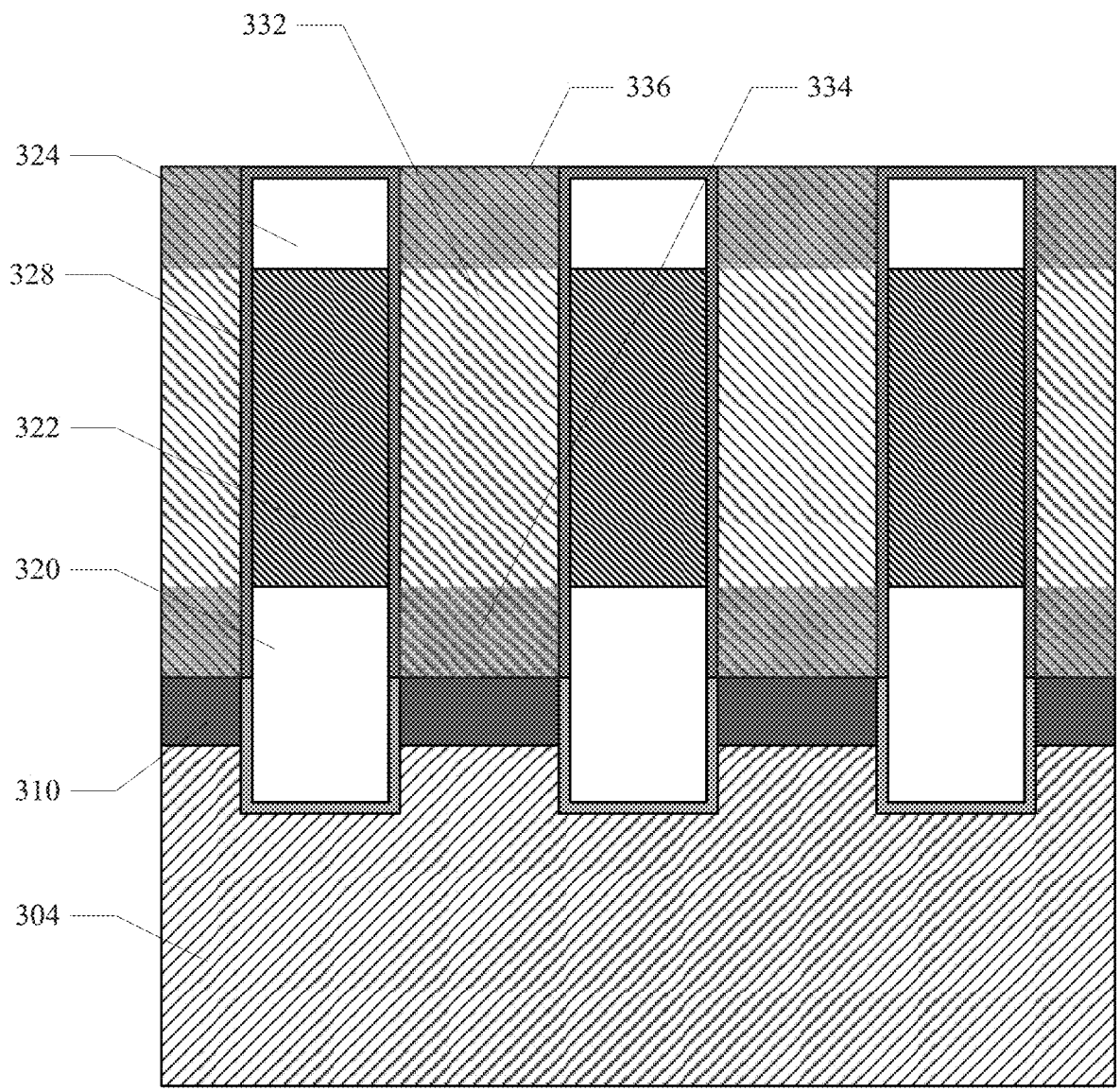
Figure 3J:
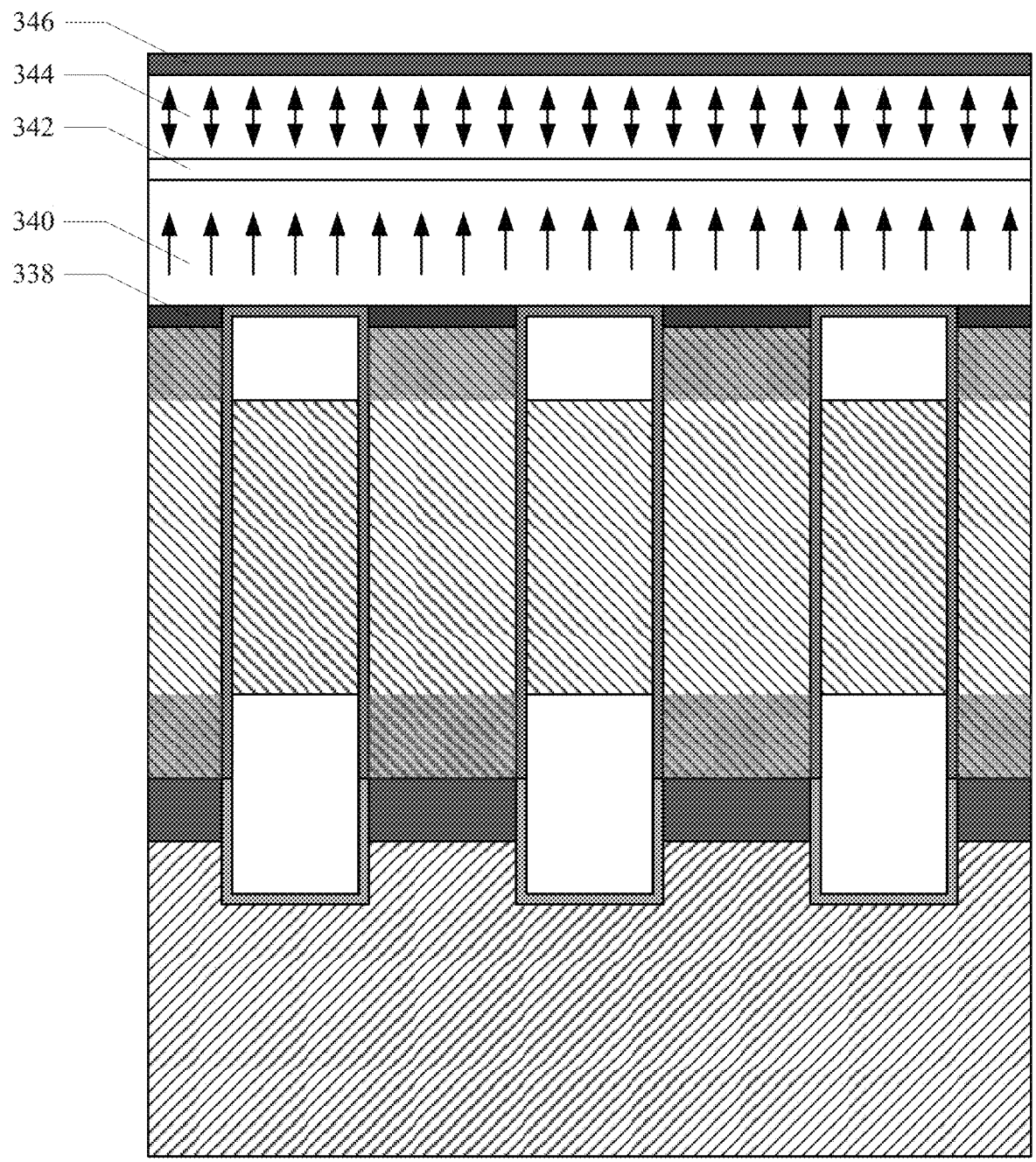
Figure 3K:
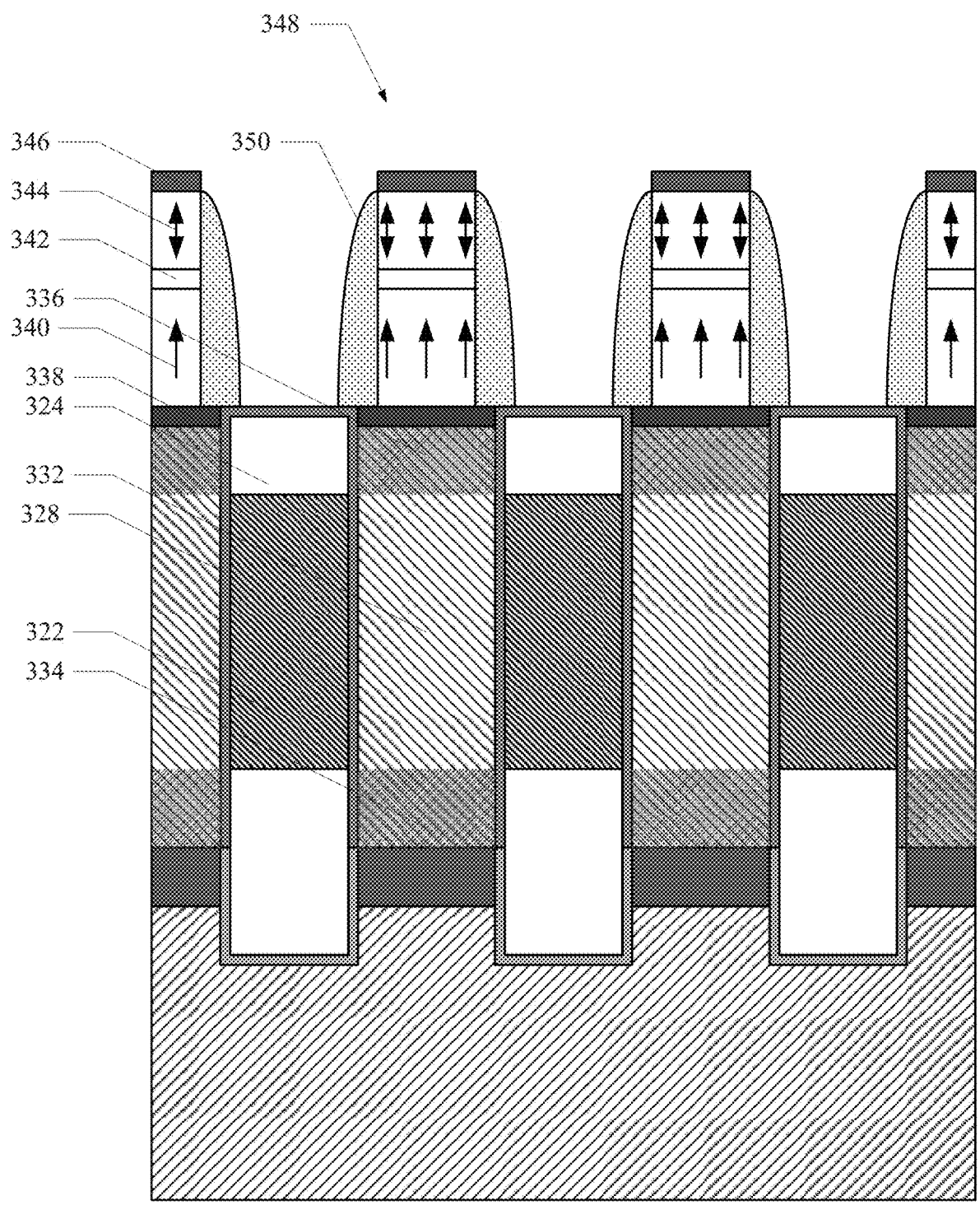
Figure 3L:
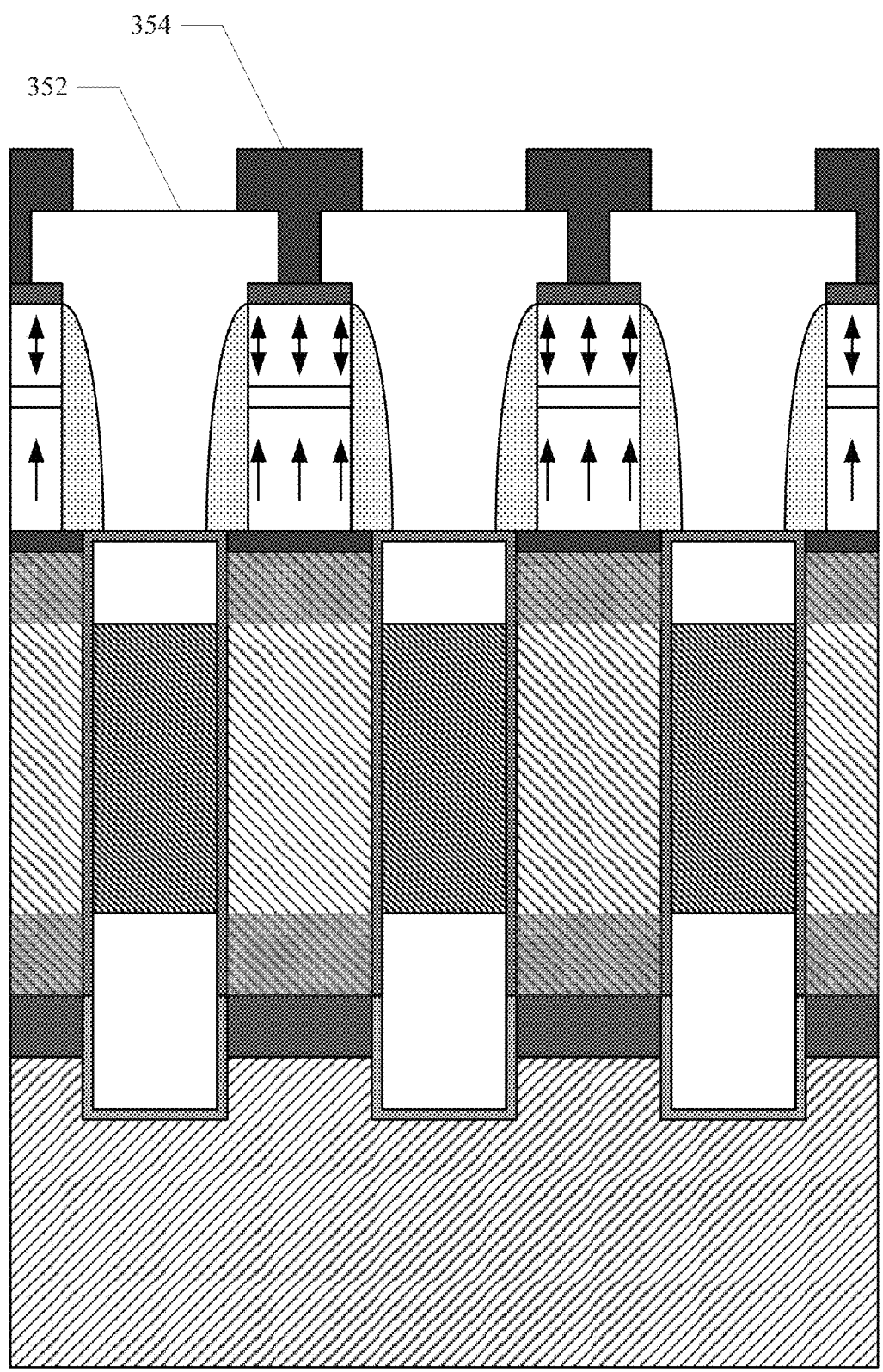
Figure 4A:
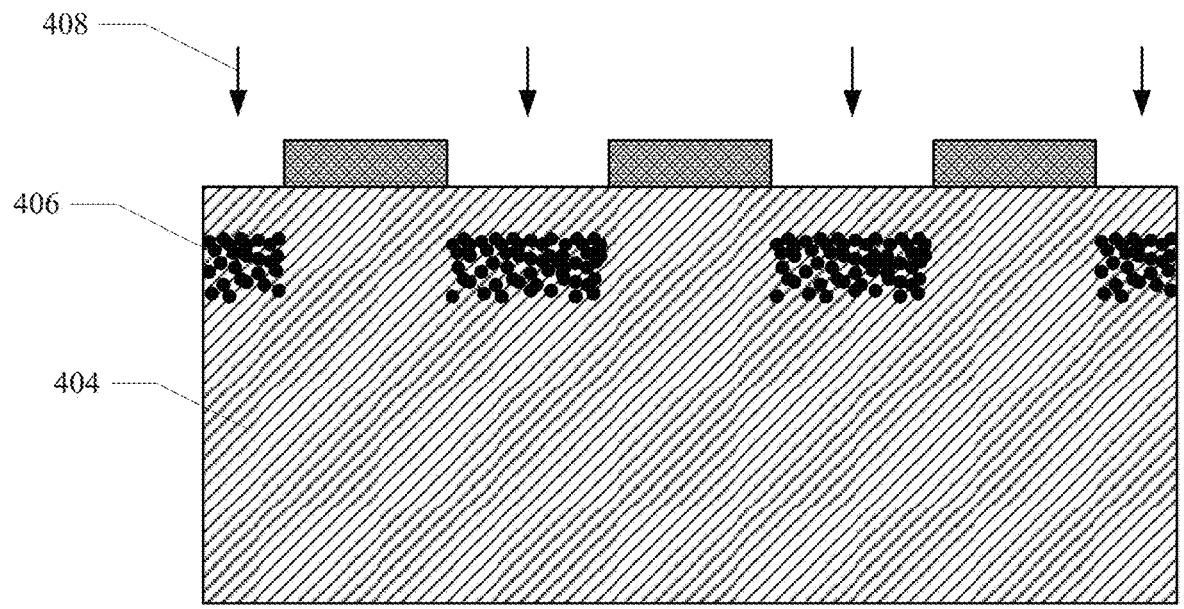
FIGS. 4A and 4B show a block diagram of partial views of an IC during manufacturing, in accordance with alternative aspects of the present technology.
Figure 4B:
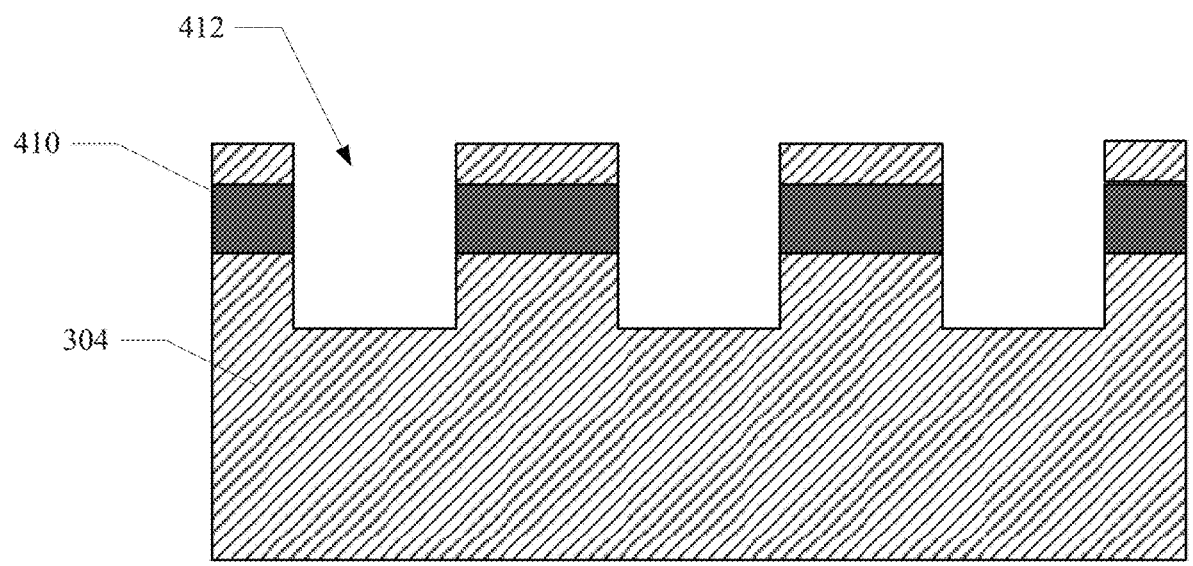

In one implementation, the first set of silicide regions 310 can be formed proximate a surface of the semiconductor substrate 304, as illustrated in FIGS. 3A and 3B. In another implementation, the first set of silicide regions 410 can be formed buried in the semiconductor substrate 404, as illustrated in FIGS. 4A and 4B. To form the buried first set of silicide regions 410, the metal ions 406 can be implanted 408 below a predetermined depth from the surface of the substrate 404.

At 225, the substrate can be selectively etched to form trenches 312 into the substrate 304 along-side the first set of silicide regions 310 and extending below the first set of silicide regions 310. The substrate 304 can be etched using an etchant that is adapted to selectively etch the silicon substrate 304 over the silicide 310. By using an etchant that is selective to silicon over the silicide, the first set of silicide regions 310 can act as a mask resulting in trenches 312 that are self-aligned to the first set of silicide regions 310. The trenches 312 can extend relatively deep below the first set of silicide regions 310 to prevent leakage currents during operation of the IC.

At 230, a nitride layer 314 can optionally be formed on the walls of the trenches 312. In one implementation, a Silicon Nitride ($Si_3N_4$) liner can be conformally deposited on the substrate using Chemical Vapor Deposition (CVD), Plasma-Enhanced Vapor Deposition (PECVD) or the like. At 235, the trenches can be filled with a first dielectric layer 316. The first dielectric layer 316 can be Silicon Oxide ($SiO_2$) deposited by CVD or the like to form a layer over the substrate 304 that fills the trenches 312. A Chemical Mechanical Polishing (CMP) can be utilized to remove excess dielectric until the surface of the first set of silicide portions 310 are exposed and the trenches therebetween remain filled with the dielectric 318.

At 240, a second dielectric layer 320 can be formed on the first set of silicide regions 310 and the dielectric 318 filing the trenches. The second dielectric layer 320 can be Silicon Oxide ($SiO_2$) deposited by CVD or the like. At 245, a first conductive layer 322 can be formed on the second dielectric layer 322. The first conductive layer 322 can be a polysilicon or metal layer. At 250, a third dielectric layer 324 can be formed over the first conductive layer 322. The third dielectric layer 324 can be Silicon Oxide ($SiO_2$) deposited by CVD or the like.

At 255, a plurality of opening 326 through the third dielectric layer 324, the first conductive layer 322 and the second dielectric layer 320 can be formed. The opening 326 can be selectively etched through the third dielectric layer 324, the first conductive layer 322 and the second dielectric layer 320 and extending to corresponding ones of the silicide regions 310. The openings 326 can be holes of approximate 100 nanometer (nm) or less in diameter. In an exemplary implementation, the holes through the third dielectric layer 324, the first conductive layer 322 and the second dielectric layer 322 can be approximate 60 nm in diameter.

At 260, a fourth dielectric layer 328 can be formed on the walls of the openings 326. In one implementation, the fourth dielectric 328 can be a high-quality Silicon Oxide ($SiO_2$), Silicon Oxynitride (SiON), Aluminium Oxide ($Al_2O_3$), or Hafnium Oxide ($HfO_2$) characterized by a high-k value conformally grown or deposited (e.g. by atomic layer deposition (ALD)) in the plurality of openings. A sacrificial layer 330, such as amorphous Silicon (Si), can optionally be formed on the fourth dielectric 328. An anisotropic etch can then be performed to remove the sacrificial layer 330 and open up epitaxial growth locations on the set of silicide regions 310 at the bottom of the openings 326.

At 265, an epitaxial deposited semiconductor 332 can be formed in the plurality of openings 326. In one implementation, the semiconductor 332 can be heteroepitaxial deposited on the first set of silicide portions 310 exposed at the bottom of the plurality of openings 326. In another implementation, the semiconductor 332 can be homoepitaxial deposited on the surface of the substrate 404 exposed at the bottom of the plurality of openings 326, when the first set of silicide portions 310 are buried below the surface of the substrate. In one implementation, an epitaxial layer 332 can be grown as the material is being deposited. The degree of achievable crystallinity can depend on thermal timing, semiconductor materials, deposition chamber, gas species and their partial pressure in the chamber. The degree of crystallinity can be single crystalline, poly-crystalline, micro-crystalline, or nano-crystalline. In another implementation, a semiconductor can be deposited at low temperature and then followed by a low temperature thermal cycle in order to foster crystallization of deposited channel material. The degree of crystallinity can be single crystalline, poly-crystalline, micro-crystalline, or nano-crystalline. In yet another implementation, a high temperature slow deposition of semiconductor material can be performed using a Reduced Pressure Chemical Vapor Deposition (RPCVD) chamber. In one implementation, the epitaxial deposited semiconductor 332 can be Silicon (Si). In one implementation, first doped regions 334 can be formed in the epitaxial semiconductor 332 in the lower portion of the plurality of openings proximate the first set of silicide regions 310, by in-situ doping of the semiconductor during a first portion of the epitaxial deposition. Second doped regions 336 in the epitaxial semiconductor 332 can be formed proximate the upper portion of the plurality of openings. The first doped regions 334 can have a first doping concentration of a first type (n-type) of dopant such as phosphorus (P) or Arsenic (As), and the second doped regions 336 can have a second doping concentration of the first type of dopant. The first and second doping concentrations can be the same or different. The portion of the epitaxial deposited semiconductor 332 between the first and second doped regions 334, 336 can have a third doping concentration of a second type of dopant such as Boron (B) or Aluminum (Al). In another implementation, the first doped regions 324 in the lower portion of the plurality of opening proximate the first set of silicide regions 310 can be doped as a result of diffusion from the first set of silicide regions 310. In another implementation, the second doped regions 336 can be doped by implanting of the first type of dopant at a desired concentration, or can be doped as a result of diffusion from an optional second set of silicide regions described below. In one implementation, the first conductive layer 322 can form gates, the fourth dielectric layer 328 can form gate dielectrics, the first doped regions 334 can form sources, and the second doped regions 336 can form drains of a plurality of selectors. The doping of the channel portions between the sources and drains can be configured to achieve a predetermined threshold voltage (Vth), and or to mitigate Short Channel Effects (SCE), such as Drain Induced Barrier Lowering (DIBL) or punchthrough. In addition, the depth of the doping of the first and second doped regions 334, 336 forming the sources and drains should be aligned with the gates. If the sources and drains overlap the gates, Gated Induced Drain Leakage (GIDL) can be incurred, and or an increase in source/drain parasitic resistance can be incurred. After epitaxial deposition, the semiconductor 332 can be Chemical Mechanical Polished (CMP) to planarize the surface of the IC.

At 270, a second set of silicide regions 338 can optionally be formed on the surface of the epitaxial semiconductor 332 in the plurality of openings. In one implementation, one or more metals can be deposited or implanted on the surface of the epitaxial semiconductor 332. The one or more metals can include Nickel (Ni), Cobalt (Co), or Titanium (Ti). The IC including the deposited metal can be thermally cycled to form the second set of silicide regions 338 in the upper portions of the epitaxial deposited semiconductor 332 in the plurality of openings. One or more thermal cycles can be utilized to achieve a predetermined specific phase of the metal silicide forming the second set of silicide regions 338. After formation of the second set of silicide regions 338, unreacted material from deposition of the one or more metals can be removed. In one implementation, the second set of silicide regions 338 can provide for good electrical contact between the plurality of selectors and the plurality of Magnetic Tunnel Junction (MTJ) cells described below.

At 275, a plurality of MTJ cells can be formed. Each MTJ cell can be coupled to a respective epitaxial semiconductor in the plurality of openings. Forming the plurality of MTJ cells can include depositing one or more reference magnetic layers 340, one or more tunneling barrier layers 342 can be deposited on the one or more reference magnetic layers 340, and one or more free magnetic layers 344 can be deposited on the one or more tunneling barrier layers 342. Numerous other layers, such as one or more seed layers, one or more Synthetic Antiferromagnetic (SAF) layers, one or more anti-ferromagnetic (AFM) coupling layers, one or more ferromagnetic (FM) coupling layers, one or more Processional Spin Current (PSC) coupling layers, one or more Perpendicular Magnetic Anisotropy (PMA) layers, one or more capping layers, one or more hard mask layers 346, and or the like, can optionally be deposited. The one or more references layers 340, one or more tunneling barrier layers 342, one or more free magnetic layers 344, and the other optional layers can be patterned to form MTJ cell pillars 348 aligned with and coupled to respective ones of the plurality of selectors 322, 328, 332-336. The one or more references layers 340, one or more tunneling barrier layers 342, one or more free magnetic layers 344, and the other optional layers can be patterned by one or more etches. The one or more etches can be configured to proceed partially into the third dielectric layer 324 between the selectors 322, 328, 332-336 to disconnect the second set of silicide regions 338 to increase isolation between the MTJ cell pillars 348. One or more spacer dielectric layers 350, contact layers and the like can be formed proximate the MTJ cell pillars 348. One or more additional dielectric layers 352 can then be deposited to fill the space between and cover the MTJ cell pillars. Openings through the one or more additional dielectric layers 352 can be formed. One or more conductive layers can then be formed to fill the opening through the one or more additional dielectric layers 352 and also cover the additional dielectric layer. The one or more conductive layers can then be pattern to form top contacts 354 on respective MTJ cell pillars 348. In one implementation, the top contacts can comprise at least a portion of a plurality of bit lines, wherein the MTJ cell pillars 348 arranged in columns are coupled together by a respective source line.

The one or more reference magnetic layers 340 can have a fixed magnetization polarization, while the magnetization polarization of the one or more free magnetic layers 344 can switch between opposite directions. Typically, if the magnetic layers have the same magnetization polarization, the MTJ cell will exhibit a relatively low resistance value corresponding to a '1' bit state; while if the magnetization polarization between the two magnetic layers is antiparallel, the MTJ cell will exhibit a relatively high resistance value corresponding to a '0' bit state.

Figure 5A:
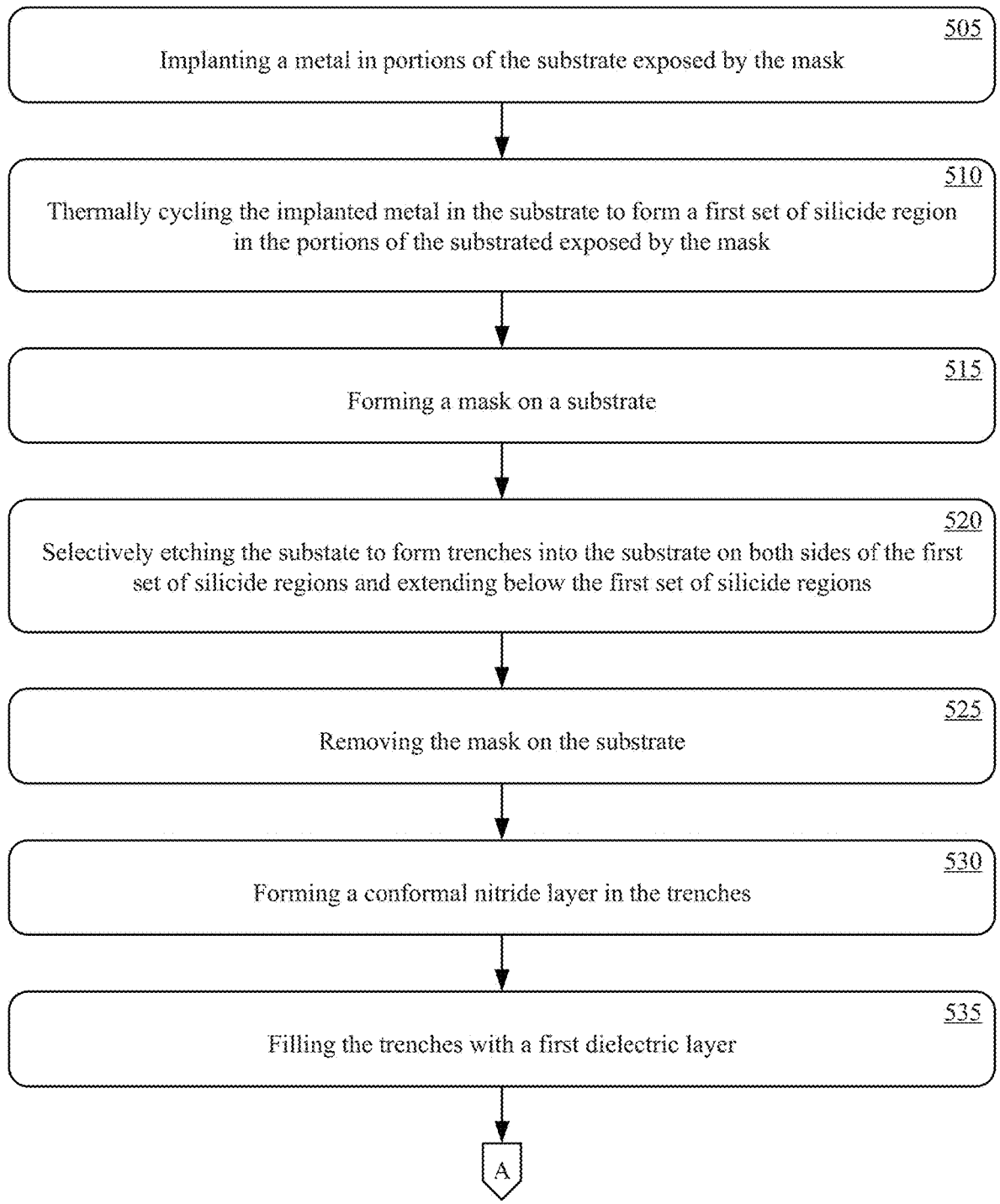
FIGS. 5A, 5B and 5C show a flow diagram of a method of manufacturing an Integrated Circuit (IC), in accordance with aspects of the present technology.
Figure 5B:
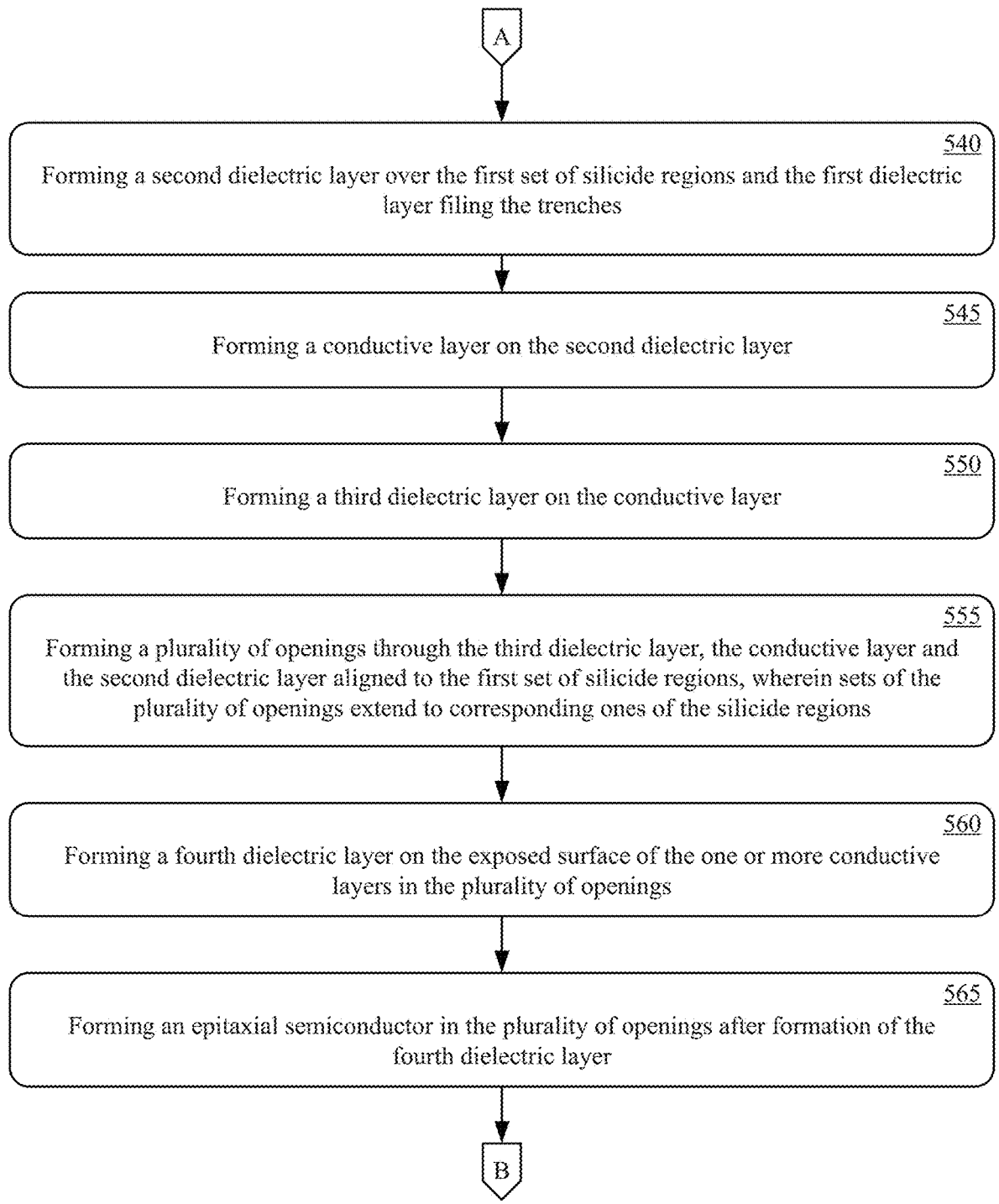
Figure 5C:
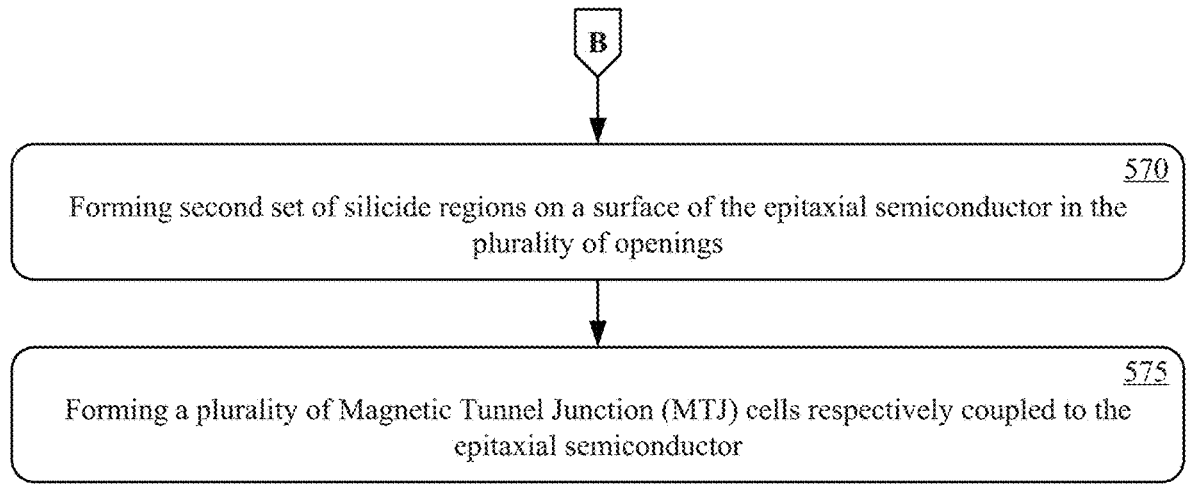

Referring now to FIGS. 5A, 5B and 5C, a method of manufacturing an Integrated Circuit (IC), in accordance with aspects of the present technology, is shown. The method of manufacturing the IC will be further explained with reference to FIGS. 6A through 6L, and FIGS. 7A, 7B and 7C, which shows partial views of the IC during manufacturing, in accordance with aspects of the present technology. The method can include forming a first set of silicide regions in portions of a substrate. In one implementation, one or more metals 602 can be implanted 604 in portions of the substrate 606, at 505. In one implementation, the substrate 606 can be a p-doped Silicon (Si) substrate. The one or more metals 602 can include Nickel (Ni), Cobalt (Co), or Titanium (Ti). The metal can be implanted in one or more sequences, such as implanting at different acceleration energies to achieve a predetermined precipitate concentration along the depth direction. At 510, the substrate 606 including the implanted metal 602 can be thermally cycled to form a first silicide region 608 in the substrate 606. One or more thermal cycles can be utilized to achieve a predetermined specific phase of the metal silicide forming the first silicide region 608.

Figure 6A:
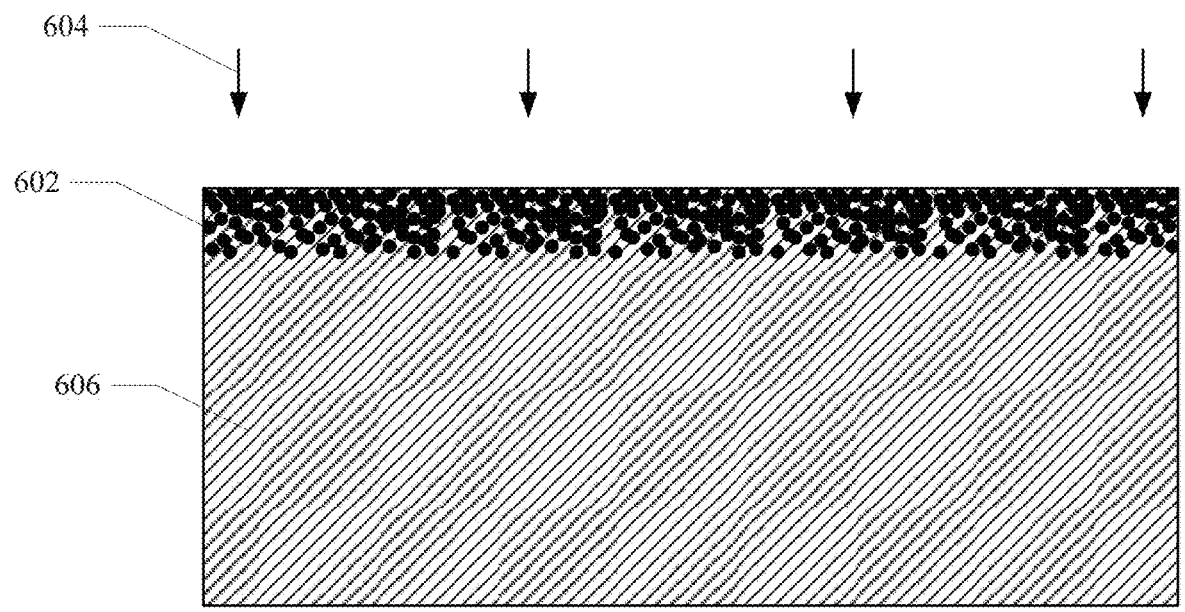
FIGS. 6A through 6L show a block diagram of partial views of an IC during manufacturing, in accordance with aspects of the present technology.
Figure 6B:
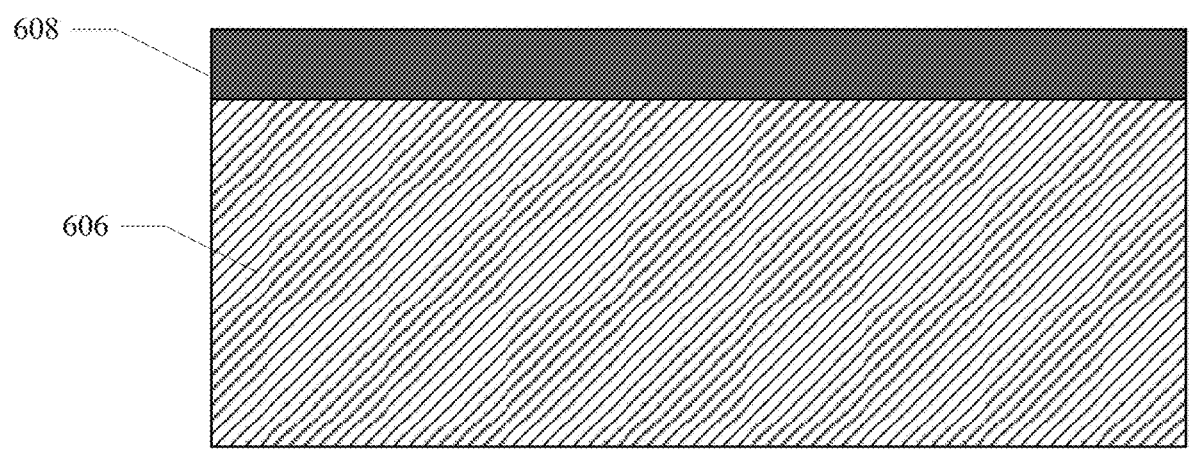
Figure 6C:
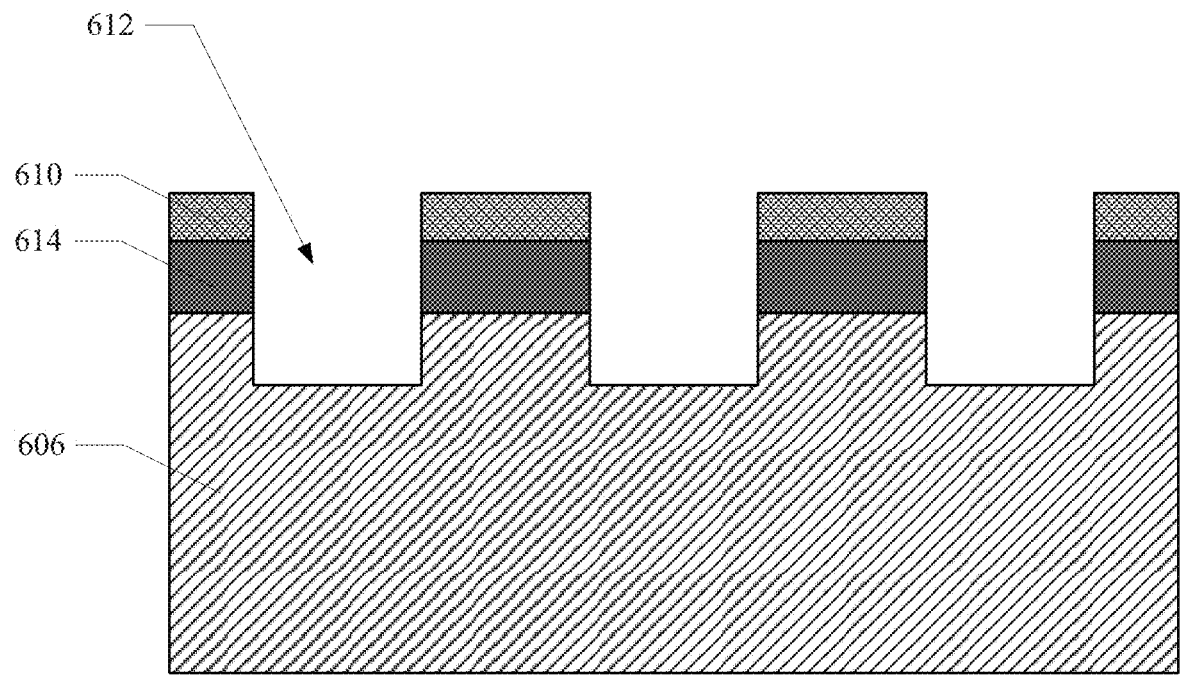
Figure 6D:
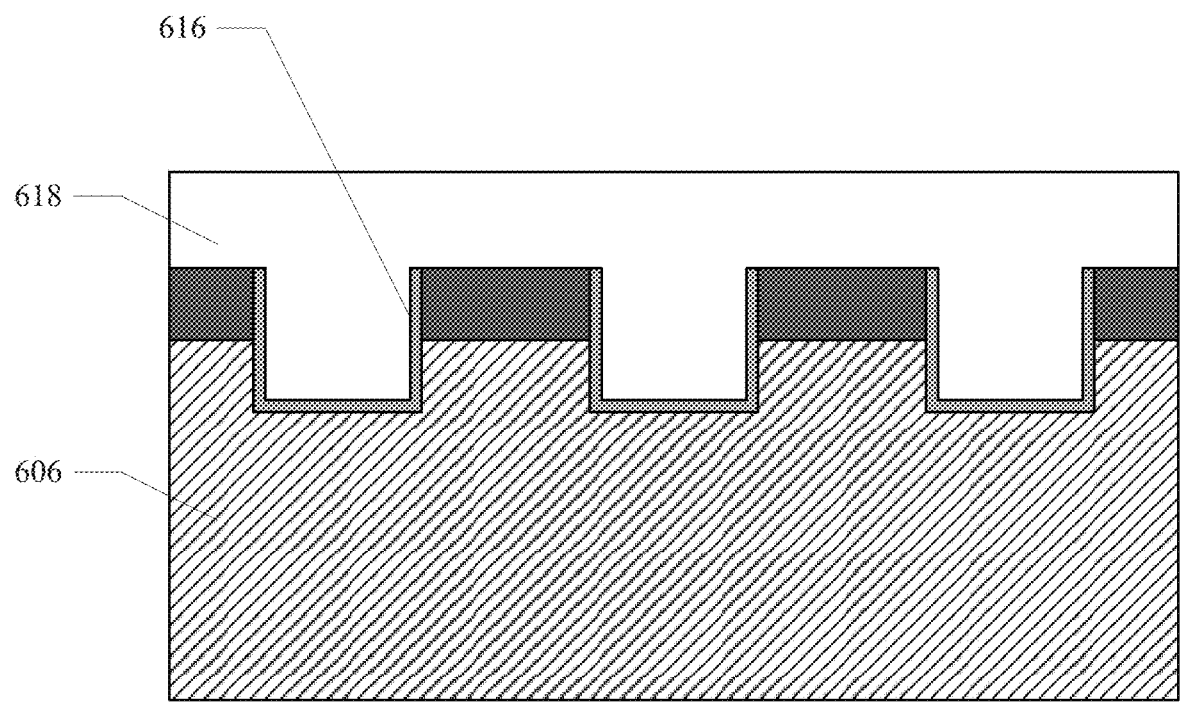
Figure 6E:
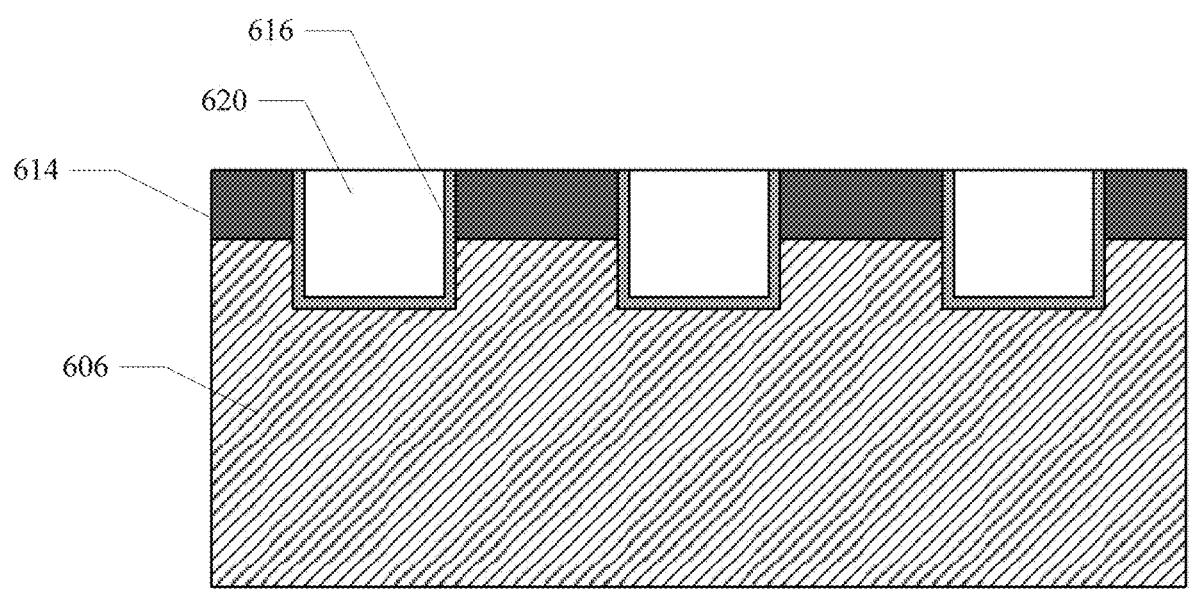
Figure 6F:
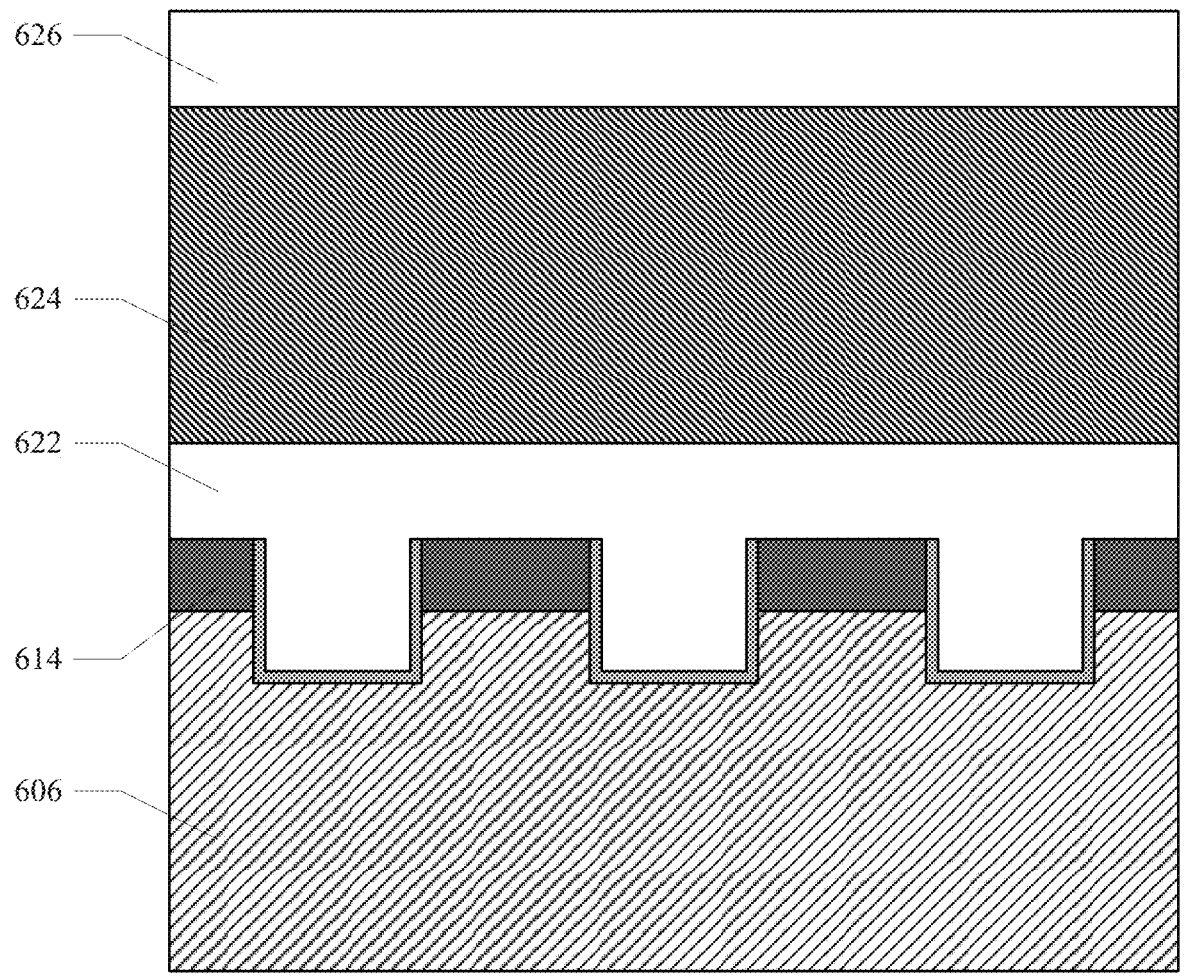
Figure 6G:
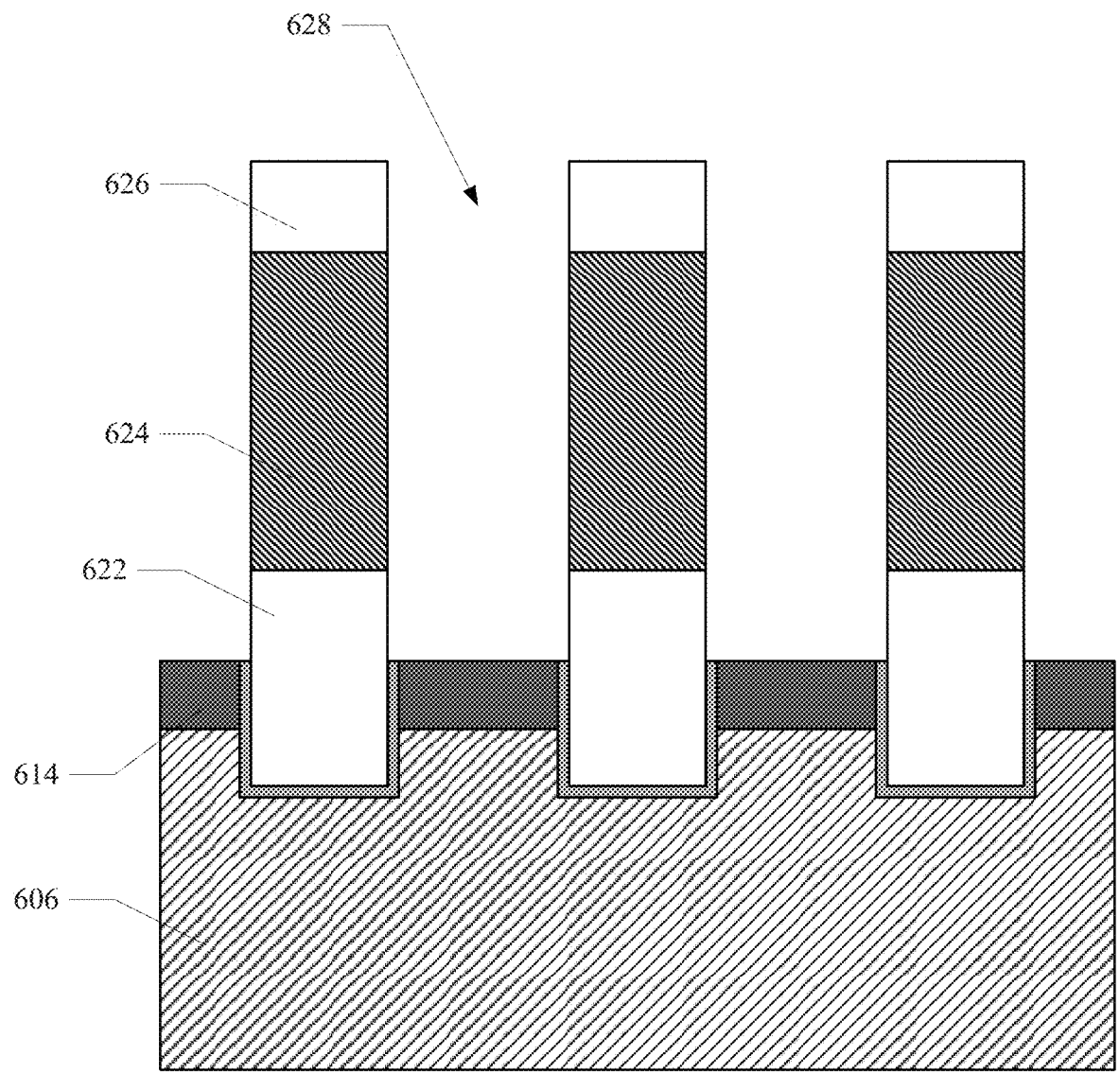
Figure 6H:
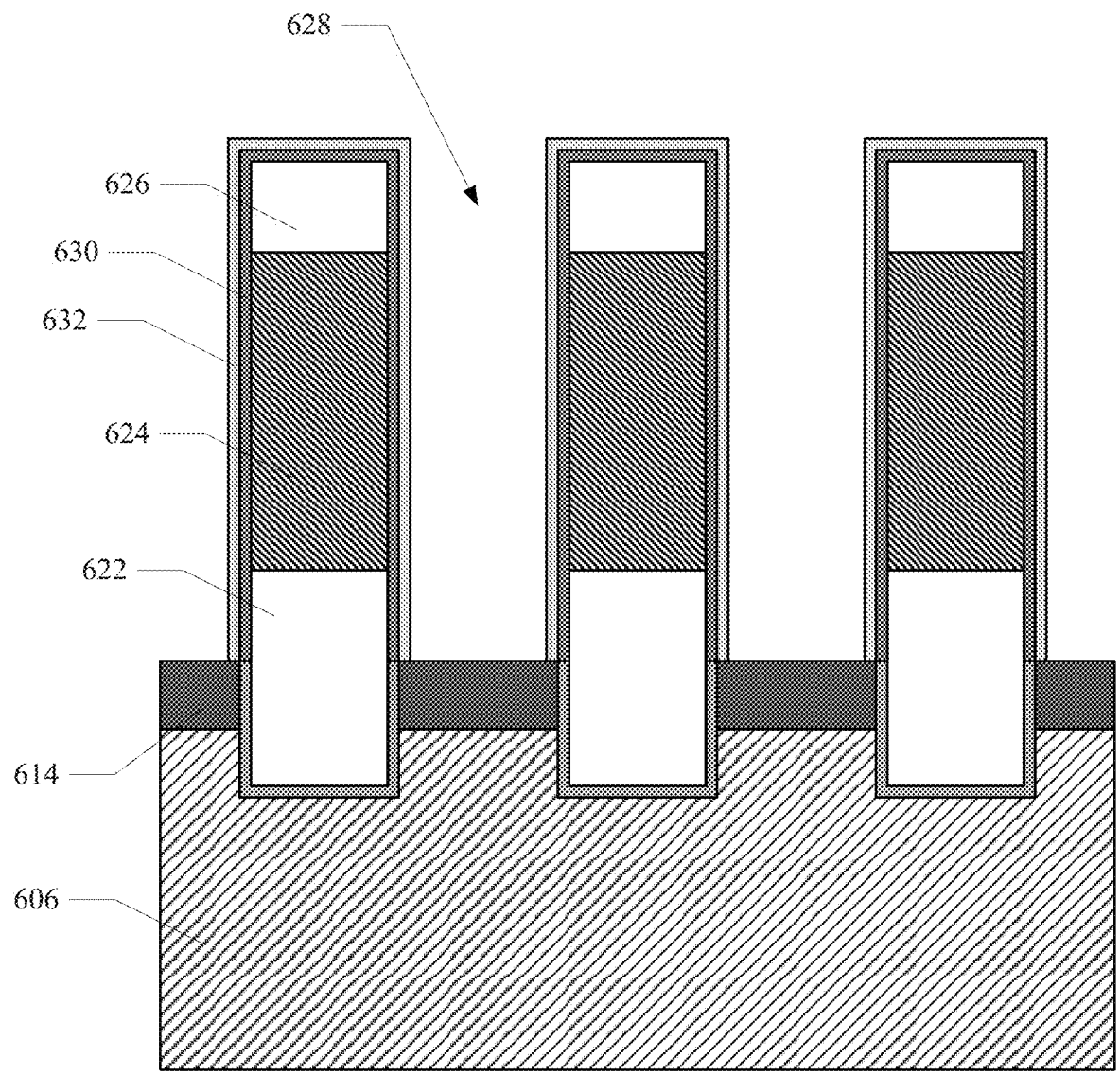
Figure 6I:
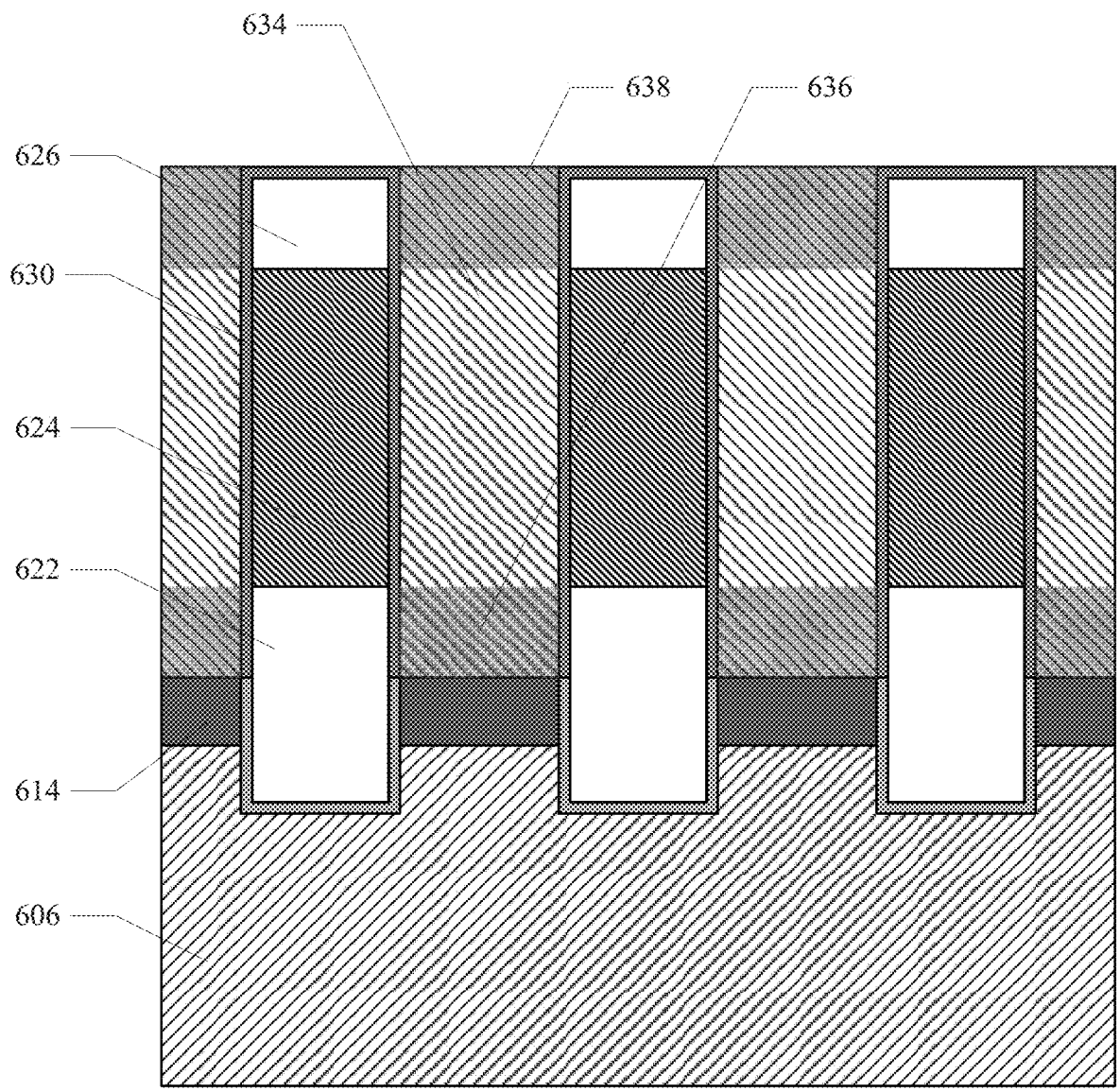
Figure 6J:
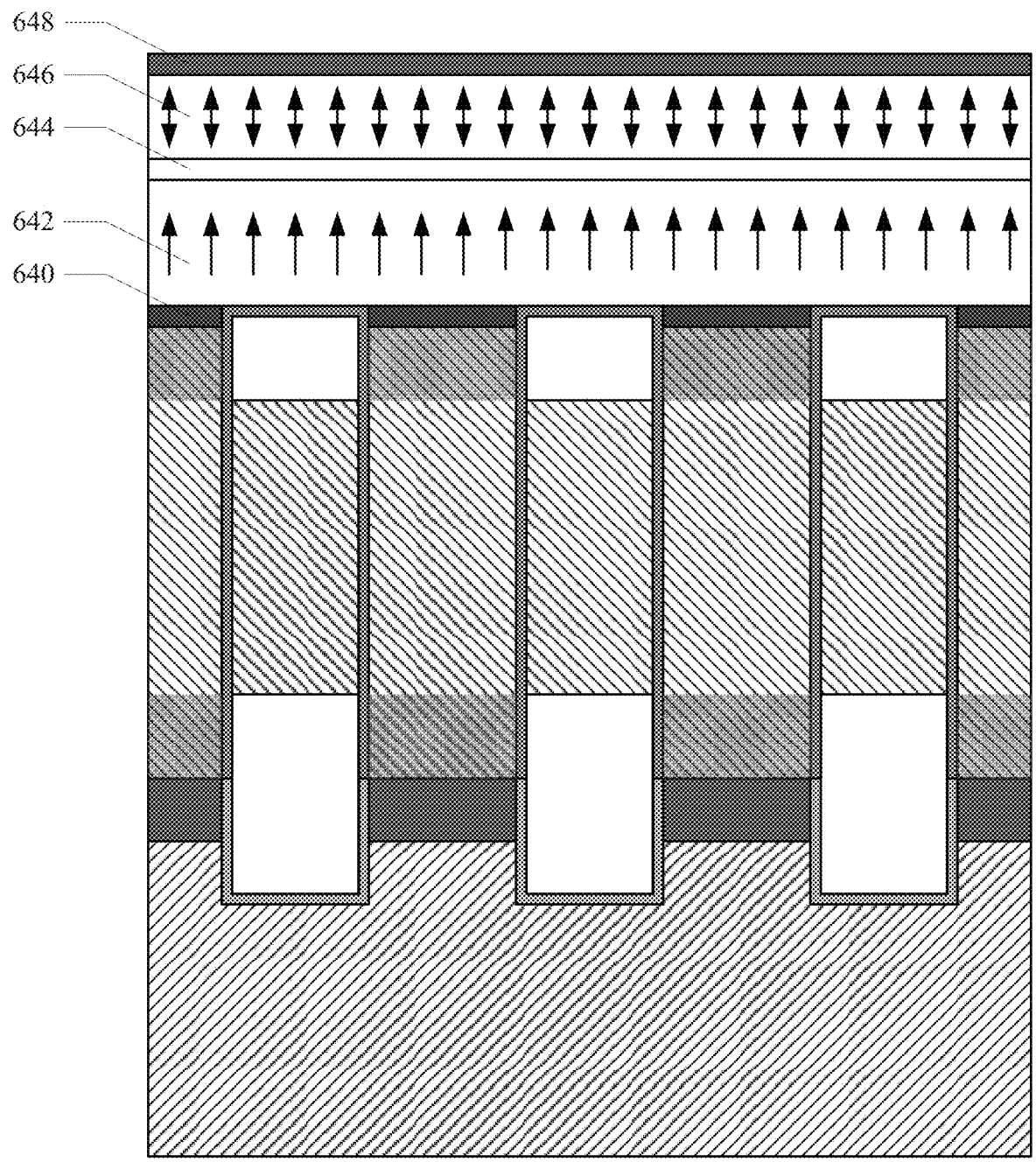
Figure 6K:
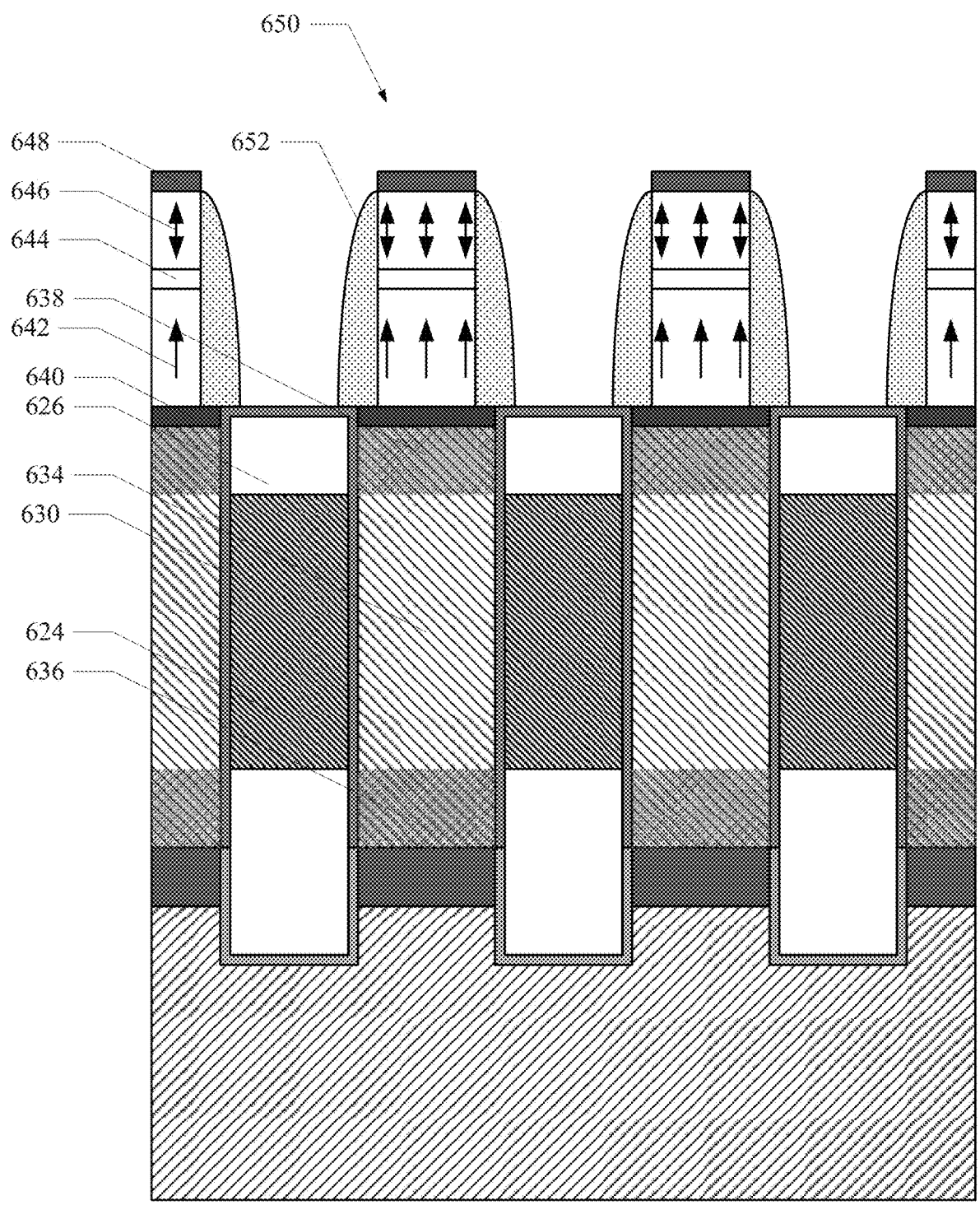
Figure 6L:
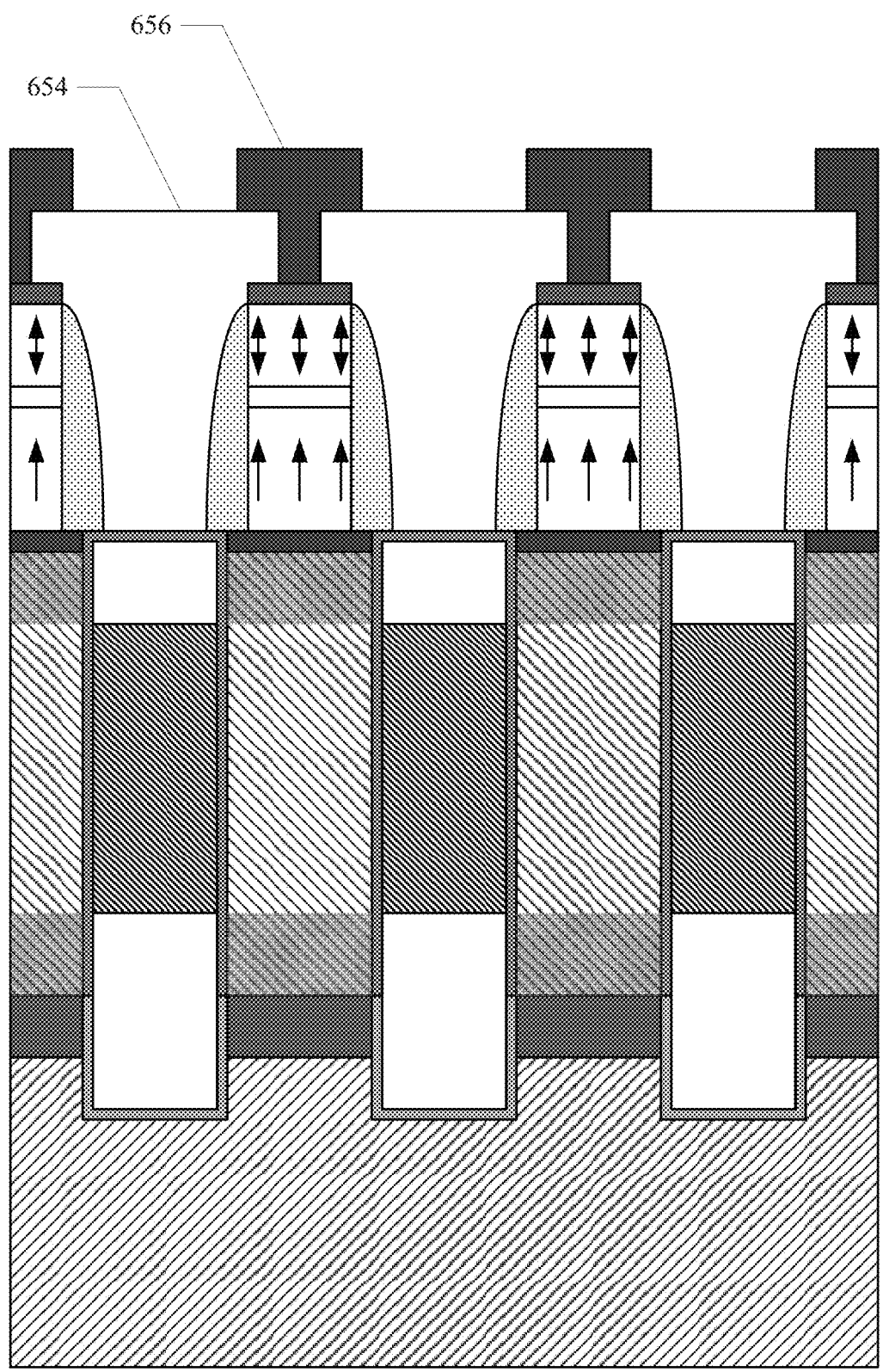
Figure 7A:
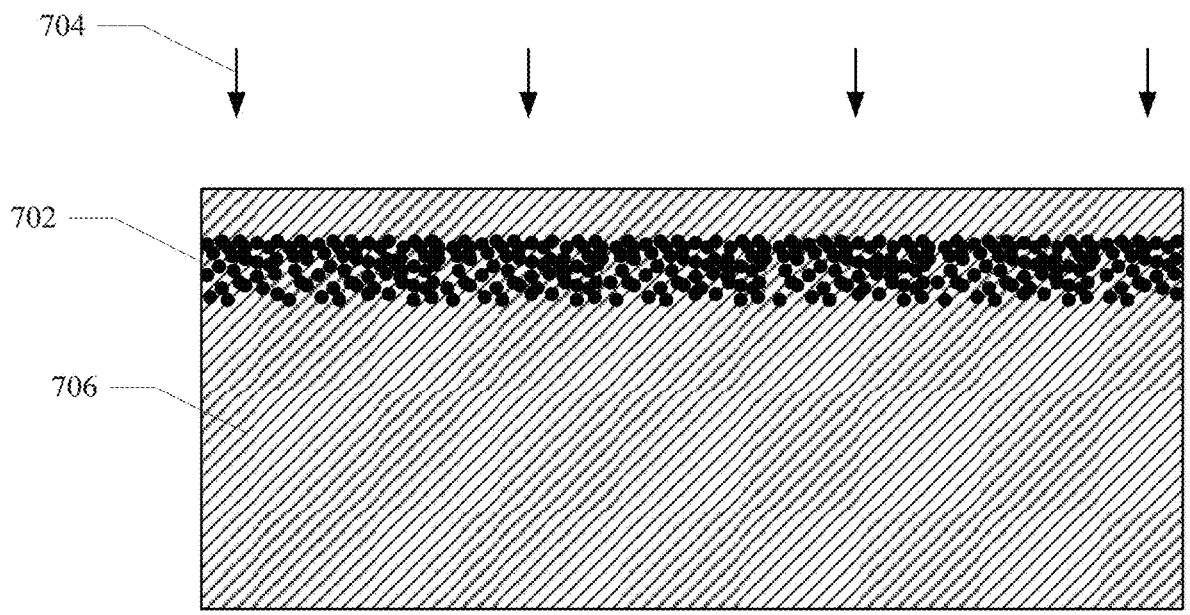
FIGS. 7A, 7B and 7C show a block diagram of partial views of an IC during manufacturing, in accordance with alternative aspects of the present technology.
Figure 7B:
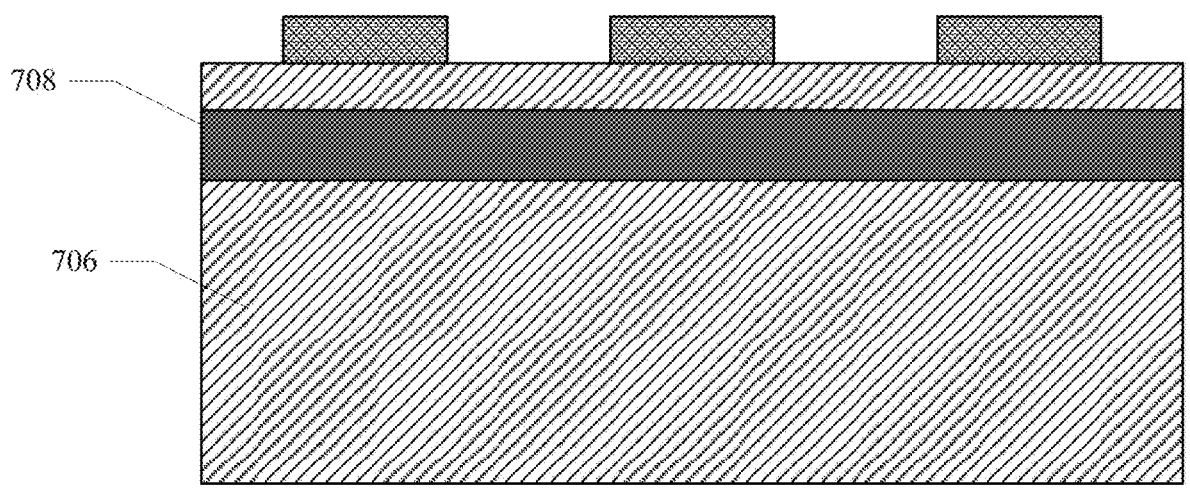
Figure 7C:
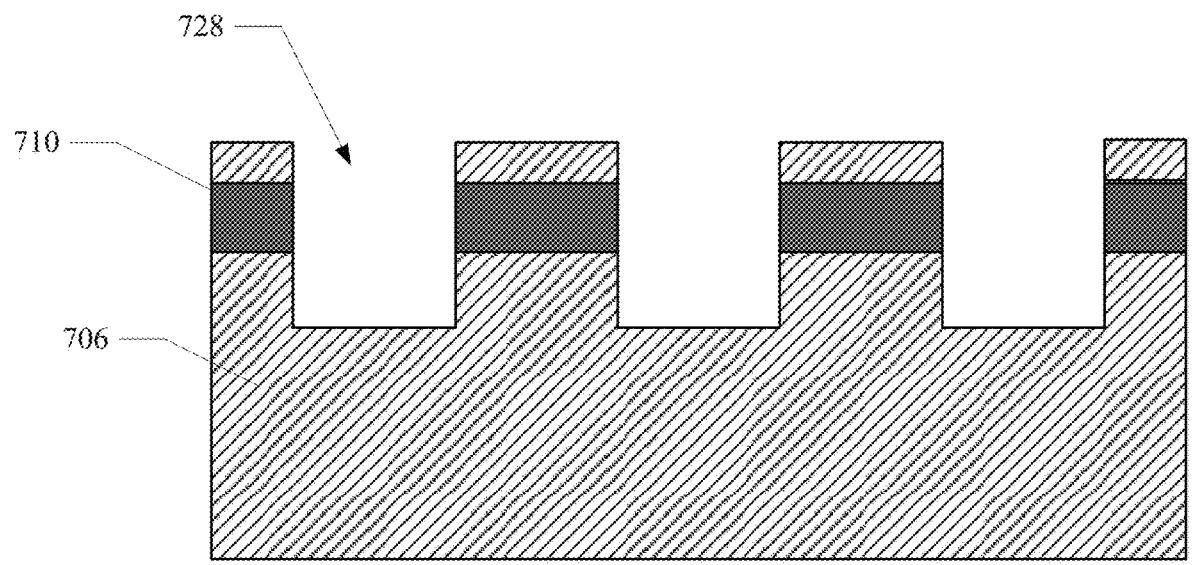

In one implementation, the first silicide region 608 can be formed proximate a surface of the semiconductor substrate 606, as illustrated in FIGS. 6A, 6B and 6C. In another implementation, the first silicide region 708 can be formed buried in the semiconductor substrate 706, as illustrated in FIGS. 7A, 7B and 7C. To form the buried first silicide region 708, the metal ions 702 can be implanted 704 below a predetermined depth from the surface of the substrate 706. The additional details shown in FIGS. 7A, 7B and 7C not described herein are substantially similar to those in FIGS. 6A, 6B and 6C.

In this embodiment, metal ions are implanted without any pattern on the semiconductor substrate. The blank ion implantation can then be followed by a very high temperature thermal annealing, which can cure any amorphized silicon surface and can create a very high-quality silicide. Because this is still a bare wafer without any active junctions formed, there is not thermal constraint. After thermal cycling is finished, a hard mask can be formed with very dense lines and space for use in etching trenches.

At 515, a mask 610 can be formed on the substrate. The mask 610 can be an organic or inorganic hard mask or a photoresist adapted for etching. The mask 610 can include a set of elongated openings with a tight pitch, providing a large length to width ratio characteristic.

At 520, the substrate exposed by the mask 610 can be selectively etched to form trenches 612 into the substrate 606 through the first silicide region and extending below the first silicide region. The etching process results in the formation of a first set of silicide regions 614 disposed between the trenches 612. The trenches 612 can extend relatively deep below the first set of silicide regions 614 to prevent leakage currents during operation of the IC. In one implementation, the first set of silicide regions 614 can form at least portions of a set of source lines. At 525, the mask 610 can be removed after implanting and thermally cycling the substrate 304.

At 530, a nitride layer 616 can optionally be formed on the walls of the trenches 612. In one implementation, a Silicon Nitride ($Si_3N_4$) liner can be conformally deposited on the substrate using Chemical Vapor Deposition (CVD), Plasma-Enhanced Vapor Deposition (PECVD) or the like. At 535, the trenches can be filled with a first dielectric layer 618. The first dielectric layer 618 can be Silicon Oxide ($SiO_2$) deposited by CVD or the like to form a layer over the substrate 606 that fills the trenches 612. A Chemical Mechanical Polishing (CMP) can be utilized to remove excess dielectric until the surface of the first set of silicide portions 614 are exposed and the trenches therebetween remain filled with the dielectric 620.

At 540, a second dielectric layer 622 can be formed on the first set of silicide regions 614 and the dielectric 620 filing the trenches. The second dielectric layer 622 can be Silicon Oxide ($SiO_2$) deposited by CVD or the like. At 545, a first conductive layer 624 can be formed on the second dielectric layer 622. The first conductive layer 624 can be a polysilicon or metal layer. At 550, a third dielectric layer 626 can be formed over the first conductive layer 624. The third dielectric layer 626 can be Silicon Oxide ($SiO_2$) deposited by CVD or the like.

At 555, a plurality of opening 628 through the third dielectric layer 626, the first conductive layer 624 and the second dielectric layer 622 can be formed. The opening 628 can be selectively etched through the third dielectric layer 626, the first conductive layer 624 and the second dielectric layer 622 and extending to corresponding ones of the silicide regions 614. The openings 628 can be holes of approximate 100 nanometer (nm) or less in diameter. In an exemplary implementation, the holes through the third dielectric layer 626, the first conductive layer 624 and the second dielectric layer 622 can be approximate 60 nm in diameter.

At 560, a fourth dielectric layer 630 can be formed on the walls of the openings 628. In one implementation, the fourth dielectric 630 can be a high-quality Silicon Oxide ($SiO_2$), Silicon Oxynitride (SiON), Aluminium Oxide ($Al_2O_3$), or Hafnium Oxide ($HfO_2$) characterized by a high-k value conformally grown or deposited (e.g. by atomic layer deposition (ALD)) in the plurality of openings. A sacrificial layer 632, such as amorphous Silicon (Si), can optionally be formed on the fourth dielectric 630. An anisotropic etch can then be performed to remove the sacrificial layer 632 and open up epitaxial growth locations on the set of silicide regions 614 at the bottom of the openings 628.

At 565, an epitaxial deposited semiconductor 634 can be formed in the plurality of openings 628. In one implementation, the semiconductor 634 can be heteroepitaxial deposited on the first set of silicide portions 614 exposed at the bottom of the plurality of openings 628. In another implementation, the semiconductor 634 can be homoepitaxial deposited on the surface of the substrate 404 exposed at the bottom of the plurality of openings 728, when the first set of silicide portions 710 are buried below the surface of the substrate 706. In one implementation, an epitaxial layer 634 can be grown as the material is being deposited. The degree of achievable crystallinity can depend on thermal timing, semiconductor materials, deposition chamber, gas species and their partial pressure in the chamber. The degree of crystallinity can be single crystalline, poly-crystalline, micro-crystalline, or nano-crystalline. In another implementation, a semiconductor 634 can be deposited at low temperature and then followed by a low temperature thermal cycle in order to foster crystallization of the deposited material. The degree of crystallinity can be single crystalline, poly-crystalline, micro-crystalline, or nano-crystalline. In yet another implementation, a high temperature slow deposition of semiconductor material 634 can be performed using a Reduced Pressure Chemical Vapor Deposition (RPCVD) chamber. In one implementation, the epitaxial deposited semiconductor 634 can be Silicon (Si). In one implementation, first doped regions 636 can be formed in the epitaxial semiconductor 634 in the lower portion of the plurality of openings proximate the first set of silicide regions 614, by in-situ doping of the semiconductor during a first portion of the epitaxial deposition. Second doped regions 638 in the epitaxial semiconductor 634 can be formed proximate the upper portion of the plurality of openings. The first doped regions 636 can have a first doping concentration of a first type (n-type) of dopant such as phosphorus (P) or Arsenic (As), and the second doped regions 638 can have a second doping concentration of the first type of dopant. The first and second doping concentrations can be the same or different. The portion of the epitaxial deposited semiconductor 634 between the first and second doped regions 636, 638 can have a third doping concentration of a second type of dopant such as Boron (B) or Aluminum (Al). In another implementation, the first doped regions 636 in the lower portion of the plurality of opening proximate the first set of silicide regions 614 can be doped as a result of diffusion from the first set of silicide regions 614. In another implementation, the second doped regions 638 can be doped by implanting of the first type of dopant at a desired concentration, or can be doped as a result of diffusion from an optional second set of silicide regions described below. In one implementation, the first conductive layer 624 can form gates, the fourth dielectric layer 630 can form gate dielectrics, the first doped regions 636 can form sources, and the second doped regions 638 can form drains of a plurality of selectors. The doping of the channel portions between the sources and drains can be configured to achieve a predetermined threshold voltage (Vth), and or to mitigate Short Channel Effects (SCE), such as Drain Induced Barrier Lowering (DIBL) or punchthrough. In addition, the depth of the doping of the first and second doped regions 636, 638 forming the sources and drains should be aligned with the gates. If the sources and drains overlap the gates, Gated Induced Drain Leakage (GIDL) can be incurred, and or an increase in source/drain parasitic resistance can be incurred. After epitaxial deposition, the semiconductor 634 can be Chemical Mechanical Polished (CMP) to planarize the surface of the IC.

At 570, a second set of silicide regions 640 can optionally be formed on the surface of the epitaxial semiconductor 634 in the plurality of openings. In one implementation, one or more metals can be deposited or implanted on the surface of the epitaxial semiconductor 634. The one or more metals can include Nickel (Ni), Cobalt (Co), or Titanium (Ti). The IC including the deposited metal can be thermally cycled to form the second set of silicide regions 640 in the upper portions of the epitaxial deposited semiconductor 634 in the plurality of openings. One or more thermal cycles can be utilized to achieve a predetermined specific phase of the metal silicide forming the second set of silicide regions 640. After formation of the second set of silicide regions 640, unreacted material from deposition of the one or more metals can be removed. In one implementation, the second set of silicide regions 640 can provide for good electrical contact between the plurality of selectors and the plurality of Magnetic Tunnel Junction (MTJ) cells described below.

At 575, a plurality of MTJ cells can be formed. Each MTJ cell can be coupled to a respective epitaxial semiconductor in the plurality of openings. Forming the plurality of MTJ cells can include depositing one or more reference magnetic layers 642, one or more tunneling barrier layers 644 can be deposited on the one or more reference magnetic layers 642, and one or more free magnetic layers 646 can be deposited on the one or more tunneling barrier layers 644. Numerous other layers, such as one or more seed layers, one or more Synthetic Antiferromagnetic (SAF) layers, one or more anti-ferromagnetic (AFM) coupling layers, one or more ferromagnetic (FM) coupling layers, one or more Processional Spin Current (PSC) coupling layers, one or more Perpendicular Magnetic Anisotropy (PMA) layers, one or more capping layers, one or more hard mask layers 648, and or the like, can optionally be deposited. The one or more references layers 642, one or more tunneling barrier layers 644, one or more free magnetic layers 646, and the other optional layers can be patterned to form MTJ cell pillars 650 aligned with and coupled to respective ones of the plurality of selectors 624, 630, 634-638. The one or more references layers 642, one or more tunneling barrier layers 644, one or more free magnetic layers 646, and the other optional layers can be patterned by one or more etches. The one or more etches can be configured to proceed partially into the third dielectric layer 626 between the selectors 624, 630, 634-638 to disconnect the second set of silicide regions 640 to increase isolation between the MTJ cell pillars 650. One or more spacer dielectric layers 652, contact layers and the like can be formed proximate the MTJ cell pillars 650. One or more additional dielectric layers 654 can then be deposited to fill the space between and cover the MTJ cell pillars. Openings through the one or more additional dielectric layers 654 can be formed. One or more conductive layers can then be formed to fill the opening through the one or more additional dielectric layers 654 and also cover the additional dielectric layer. The one or more conductive layers can then be pattern to form top contacts 656 on respective MTJ cell pillars 650. In one implementation, the top contacts can comprise at least a portion of a plurality of bit lines, wherein the MTJ cell pillars 650 arranged in columns are coupled together by a respective source line.

The one or more reference magnetic layers 642 can have a fixed magnetization polarization, while the magnetization polarization of the one or more free magnetic layers 646 can switch between opposite directions. Typically, if the magnetic layers have the same magnetization polarization, the MTJ cell will exhibit a relatively low resistance value corresponding to a '1' bit state; while if the magnetization polarization between the two magnetic layers is antiparallel, the MTJ cell will exhibit a relatively high resistance value corresponding to a '0' bit state.

Figure 8:
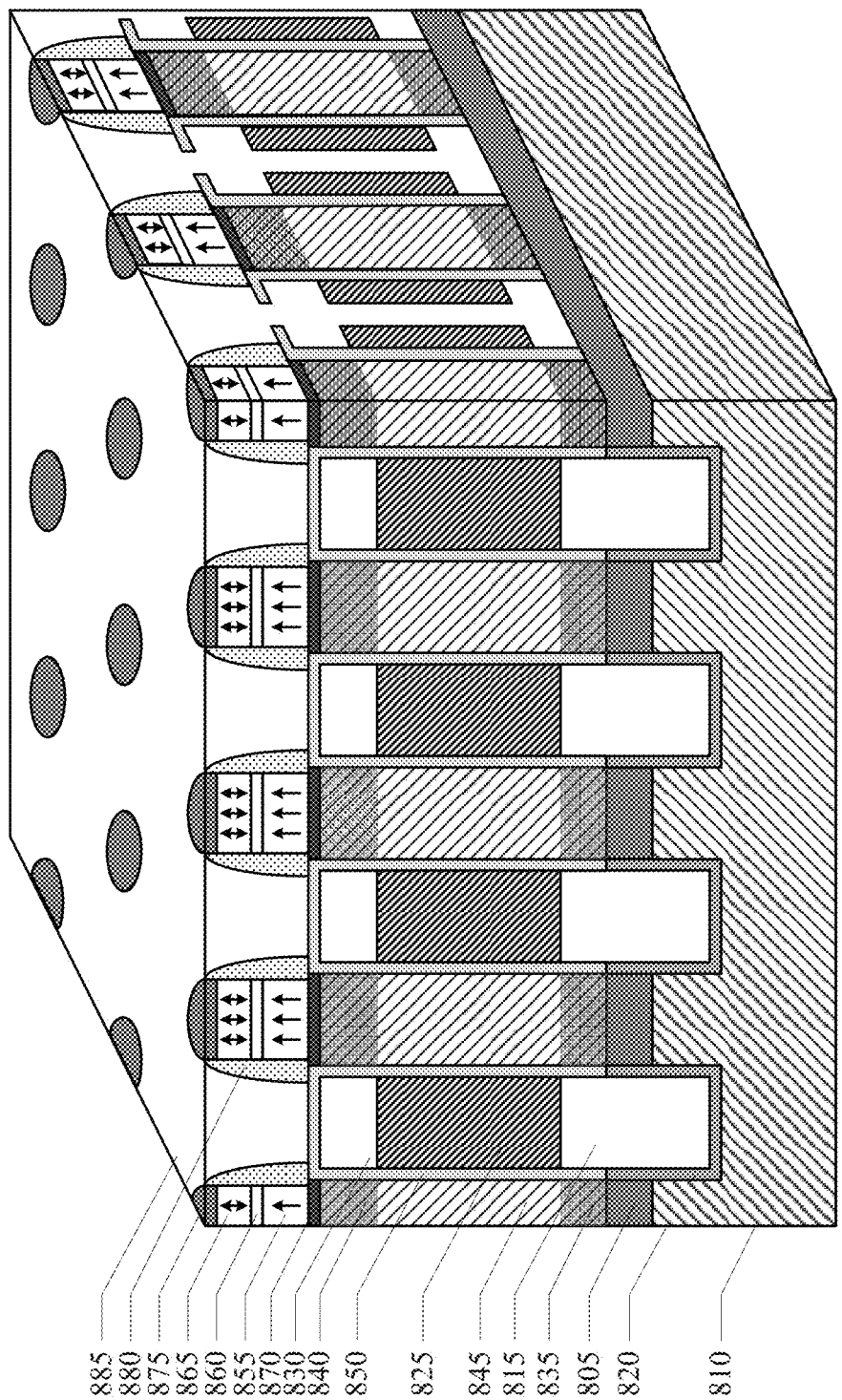
FIG. 8 shows a block diagram of a MRAM memory cell array, in accordance with aspects of the present technology.

Referring now to FIG. 8, a MRAM memory cell array, in accordance with aspects of the present technology, is shown. The MRAM memory cell array can include a first plurality of silicide regions 805 disposed in a substrate 810. In one implementation, the substrate 810 can be a Silicon (Si) substrate and the plurality of silicide region 805 can be Nickel Silicide (NiSi), Cobalt Silicide ($CoSi_2$), or Titanium Silicide ($TiSi_2$). A plurality of trenches can be disposed about the first plurality of silicide regions 805 and extend into the substrate 810 below the first plurality of silicide regions 805. The first plurality of silicide regions 805 can comprise elongated bars with a tight pitch. A plurality of a first dielectric regions 815 can be disposed in the plurality of trenches and extend above the first plurality of silicide regions 805. Optionally, a nitride layer 820 can be disposed between the first dielectric regions 815 and both the substrate and the first plurality of silicide regions 805. In one implementation the first dielectric regions 815 can be Silicon Oxide ($SiO_2$) and the nitride layer 820 can be Silicon Nitride ($Si_3N_4$).

A plurality of first conductive regions 825 can be disposed above the plurality of first dielectric regions 815, and a plurality of second dielectric regions 830 can be disposed above the first conductive regions 825 in the plurality of trenches. In one implementation, the first conductive regions 825 can be polysilicon (Si) or a conductor, and the second dielectric regions can be Silicon Oxide ($SiO_2$).

An semiconductor material with various degree of crystallinity 835-845 can be disposed in holes extending through the plurality of second dielectric regions 830, the plurality of conductive regions 825 and the plurality of first dielectric regions 815 and down to the plurality of silicide regions 805. Sets of the semiconductor material with various degree of crystallinity 835-845 can be coupled to corresponding silicide regions 805. In one implementation, the semiconductor material with various degree of crystallinity 835-845 can include first portions 835 doped with a first type of dopant, and can be disposed proximate the plurality of silicide regions 805. Second portions 840 can be doped with the first type of dopant, and can be disposed proximate the plurality of MTJ cell pillars described below. Third portions 845 can be doped with a second type of dopant, and can be disposed between the first and second portions 835, 840. In one implementation, the first and second portions 835, 840 of the semiconductor material with various degree of crystallinity can be Silicon (Si) doped with phosphorus (P) or Arsenic (As), and the third portions of the semiconductor material with various degree of crystallinity can be Silicon (Si) doped with Boron (B) or Aluminum (Al).

A third dielectric region 850 can be disposed between the first conductive regions 825 and the plurality semiconductor materials with various degree of crystallinity 835-845. In one implementation, the third dielectric region 850 can be a high-quality Silicon Oxide ($SiO_2$), Silicon Oxynitride (SiON), Aluminium Oxide ($Al_2O_3$), or Hafnium Oxide ($HfO_2$) characterized by a high-k value. In one implementation, the conductive layer 825, the third dielectric layer 850, and the plurality of semiconductor materials with various degree of crystallinity 835-845 can comprise a plurality of selectors. The conductive layer 825 can be configured as the gates, the third dielectric layer 805 can be configured as the gate oxides, the first portions of the semiconductor material with various degree of crystallinity 835 can be configured as the sources, the second portions of the semiconductor material with various degree of crystallinity 840 can be configured as the drains, and the third portions of the semiconductor material with various degree of crystallinity 845 can be configured as the channels of respective selector transistors. The conductive layer 825 can complete surround the semiconductor material with various degree of crystallinity 835 along rows to form portions of word lines. The conductive layer 825 between adjacent rows can be patterned and separated by a fourth dielectric layer 885 described below.

A plurality of Magnetic Tunnel Junction (MTJ) cell pillars 855-865 can be disposed on corresponding ones of the plurality of semiconductor material with various degree of crystallinity regions 835-845. The plurality of MTJ cell pillars can include a reference magnetic layer 855, a tunneling barrier layer 860 and a free magnetic layer 865. The reference magnetic layer 855 can have a fixed magnetization polarization, while the magnetization polarization of the free magnetic layer 865 344 can switch between opposite directions. In one implementation, the reference magnetic layer 855 can be coupled to respective semiconductor material with various degree of crystallinity regions 835-845 by an optional second set of silicide regions 870. The second set of silicide regions 870 can be a Nickel Silicide (NiSi), Cobalt Silicide ($CoSi_2$), or Titanium Silicide ($TiSi_2$). The MTJ cells can also include a number of other layers such as one or more seed layers, one or more Synthetic Antiferromagnetic (SAF) layers, one or more anti-ferromagnetic (AFM) coupling layers, one or more ferromagnetic (FM) coupling layers, one or more Processional Spin Current (PSC) coupling layers, one or more Perpendicular Magnetic Anisotropy (PMA) layers, one or more capping layers, one or more hard mask layers 875, pillar spacers 880 and or the like. In addition, a fourth dielectric layer 885 can be disposed between and over (not shown) the MTJ cell pillars 855-865. In addition, a plurality of contacts (not shown) can be coupled to the free magnetic layer 865 through the optional second set of silicide regions 870. In one implementation, the fourth dielectric layer 885 can be an Oxide or Spin-on-Glass (SOG) layer.

Aspects of the above described present technology can advantageously reduce void formation and surface non-uniformity of the silicide. The reduction of void formation and improved surface uniformity can advantageously reduce leakage current and or enable further reduction in the minimum feature size of structures in the IC.

Figure 9:
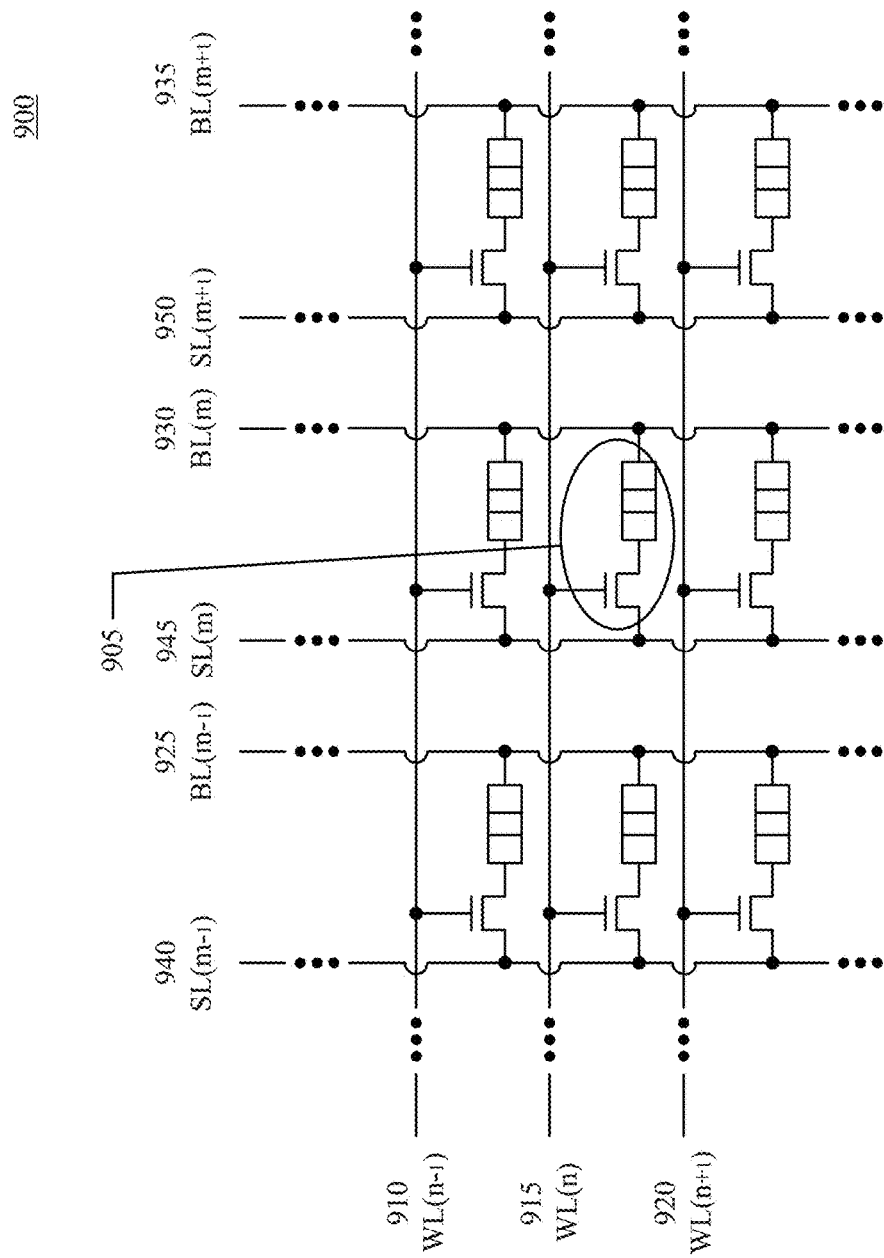
FIG. 9 shows a circuit diagram of a MRAM memory cell array, in accordance with aspects of the present technology.

Referring now to FIG. 9, a circuit diagram of a MRAM memory cell array, in accordance with aspects of the present technology, is shown. The memory cell array 900 can include a plurality of MTJ memory cells 905, a plurality of word lines 910-920, a plurality of bit lines 925-935 and a plurality of source lines 940-950. The word lines 910-920 of the memory cell array 900 can be organized along columns of the array. The bit lines 925-935 and source lines 940-950 can be organized along rows of the array. The source lines 940-950 can comprise a first set of silicide regions as described above. Each memory cell 905 can comprise a MTJ cell and a selector. In one implementation, the gates of the selectors arranged along columns of the array can be coupled to respective word lines 910-920. The sources of the selectors arranged along rows of the array can be coupled to respective source lines 940-950. The free magnetic layer of the MTJ cells arranged along rows of the array can be coupled to a respective bit line 925-935.

In one example, to read data from a given MTJ cell 905, the respective bit line BL(m) 930 can be biased at a bit line read potential (e.g., $V_{BLR}$) and the respective source line SL(m) 945 can be biased at ground (e.g., 0). When the respective word line WL(n) 915 is biased at a word line read voltage potential (e.g., $V_{WLR}$) a current proportional to the resistance of the MTJ of the cell 905 will flow from the respective bit line BL(m) 930 to the respective source line SL(m) 945. In such case, the current sensed on the respective bit line BL(m) 930 can indicate the state of the selected cell 905.

To write a logic '0' state to the given memory cell 905, the respective bit line BL(m) 930 can be biased at a bit line write potential (e.g., $V_{BLW}$) and the respective source line SL(m) 945 can be biased at ground (e.g., 0). When the respective word line WL(n) 915 is biased at a word line write potential (e.g., $V_{WLW}$) a resulting current flowing through the MTJ of the cell 905 in a first direction will cause the free magnetic layer into a state corresponding to a logic '0' state. To write a logic '1' state to the given memory cell 905, the respective bit line BL(m) 930 can be biased at ground (e.g., 0) and the respective source line SL(m) 945 can be biased at a source line write potential (e.g., $V_{SLW}$). When the respective word line WL(n) 915 is biased at a word line write potential (e.g., $V_{WLW}$) a resulting current flowing through the MTJ of the cell 905 in a second direction will cause the free magnetic layer into a state corresponding to a logic '1' state.

In another example, to read data from a given memory cell 905, the respective bit line BL(m) 930 can be biased at ground (e.g., 0) and the respective source line SL(m) 945 can be biased at a bit line read potential (e.g., $V_{BLR}$). When the respective word line WL(n) 915 is biased at a word line read potential (e.g., $V_{WRL}$) a current proportional to the resistance of the MTJ of the given cell 905 will flow. In such case, the current sensed on the respective source line SL(m) 945 can indicate the state of the selected cell 905.

To write a logic '0' state to the given memory cell 905, the respective bit line BL(m) 930 can be biased at a bit line write potential (e.g., $V_{BLW}$) and the respective source line SL(m) 945 can be biased at ground (e.g., 0). When the respective word line WL(n) 915 is biased at a word line write potential (e.g., $V_{WLW}$) a resulting current flowing through the MTJ of the cell 905 in a first direction will cause the free magnetic layer into a logic '0' state. To write a logic '1' state to a given memory cell 905, the respective bit line BL(m) 930 can be biased at ground (e.g., 0) and the respective source line SL(m) 945 can be biased at a source line write potential (e.g., $V_{SLW}$). When the respective word line WL(n) 915 is biased at a word line write state (e.g., $V_{WLW}$) a resulting current flowing through the MTJ of the cell 905 in a second direction will cause the free magnetic layer into a logic '1' state.

Figure 10:
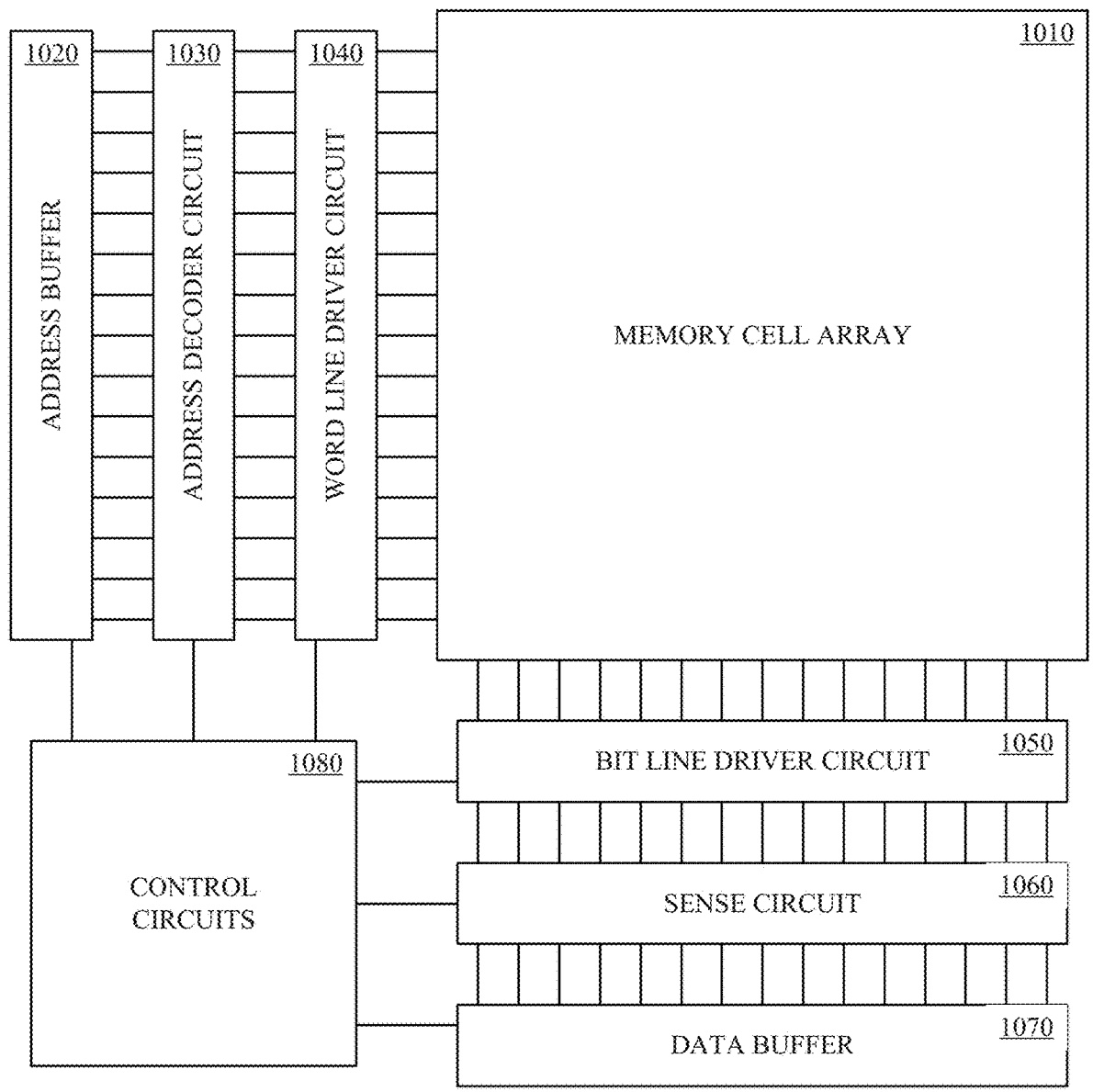
FIG. 10 shows a block diagram of a memory device, in accordance with aspects of the present technology.

Referring now to FIG. 10, a block diagram of a memory device, in accordance with aspects of the present technology, is shown. The memory device 1000 can be a Magnetoresistive Random Access Memory (MRAM), Spin Torque Magnetoresistive Random Access Memory (ST-MRAM), a Phase Change Memory (PCM), a stackable cross-gridded Phase Change Memory, Resistive Random Access Memory (Re-RAM), or similar memory device. In aspects, the memory device 1000 can include a memory cell array 1010, an address buffer 1020, an address decoder circuit 1030, a word line driver circuit 1040, a bit line driver circuit 1050, a sense circuit 1060, a data buffer 1070, and control circuit 1080. In one implementation, the memory cell array 1010 can include a plurality of MTJ memory cells as described above. The memory device 1000 can also include other well-known circuits that are not necessary for an understanding of the present technology and therefore are not discussed herein.

In aspects, the memory cell array 1010 can include a plurality of memory cells organized in rows and columns, with sets of word lines, bit lines and optionally source lines spanning the array of cells throughout the chip. The address buffer 1020 can be configured to receive and buffer a plurality of address signals. The address decoder 1030 can receive the plurality of address signals buffered by the address buffer 1020 and output a plurality of decoded address signals. The address decoder 1030 can map a given memory address to a particular row of memory cells in the array.

In aspects, the output of the address decoder 1030 can be input to the word line driver 1040 upon a first state of a clock signal. In one implementation, the word line driver 1040 can receive the plurality of decoded address signals upon receipt of a low state of a clock signal and latch the plurality of decoded address signal upon a high state of the clock signal. The word line driver 1040 can level shift the received decoded address signals to word line drive signals, and latch the plurality of word line drive signals. The output of the word line driver 1040 can drive the word lines to select a given word line of the array 1010 based on the plurality of word line drive signals.

In aspects, the bit line driver 1050 and the sense circuit 1060 utilize the bit lines, and/or optionally the source lines, of the array 1010 to read from and write to memory cells of a selected word line of the array 1010. The data read from and written to the memory cells can be buffered in the data buffer 1070. The control circuit 1080 can generate one or more control signals for the control of one or more of the address buffer 1020, the address decoder circuit 1030, the word line driver circuit 1040, the bit line driver circuit 1050, the sense circuit 1060, the data buffer 1070.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. An Integrated Circuit (IC) comprising:
a plurality of first silicide regions disposed in a substrate;
a plurality of trenches disposed between the plurality of first silicide regions and extending into the substrate below the plurality of first silicide regions;
a plurality of first dielectric regions disposed in the plurality of trenches and over the plurality of first silicide regions;
a plurality of first conductive regions disposed above the plurality of first dielectric regions;
a plurality of second dielectric regions disposed above the plurality of first conductive regions;
a plurality of semiconductor materials with various degree of crystallinity regions disposed in holes extending through the plurality of second dielectric regions, the plurality of conductive regions and the plurality of first dielectric regions and down to the plurality of first silicide regions, wherein the plurality of semiconductor materials with various degree of crystallinity regions are coupled to corresponding first silicide regions;
a third dielectric region disposed between the first conductive regions and the plurality of semiconductor materials with various degree of crystallinity regions; and
a plurality of Magnetic Tunnel Junction (MTJ) cell pillars disposed on corresponding ones of the plurality of semiconductor materials with various degree of crystallinity regions.

2. The IC according to claim 1, further comprising:
a fourth dielectric region encapsulating the plurality of MTJ cell pillars the plurality of MTJ cell pillars; and
a plurality of second conductive regions disposed on the fourth dielectric region and extending through vias in the fourth dielectric region to the plurality of MTJ cell pillars, wherein corresponding one of the second conductive regions are coupled to sets of the MTJ cell pillars.

3. The IC according to claim 1, wherein the plurality of semiconductor materials with various degree of crystallinity regions comprise:
first portions doped with a first type of dopant at a first concentration proximate the plurality of first silicide regions;
second portions doped with the first type of dopant at a second concentration proximate the plurality of MTJ cell pillars; and
third portions doped with a second type of dopant at a third concentration and disposed between the first and second portions.

4. The IC according to claim 1, wherein:
the substrate comprises a Silicon (Si) substrate; and
the plurality of first silicide regions comprise Titanium Silicide ($TiSi_2$), Nickel Silicide (NiSi) or Cobalt Silicide ($CoSi_2$) regions disposed in the Silicon (Si) substrate.

5. The IC according to claim 2, wherein:
the plurality of first dielectric regions comprise a first Silicon Oxide ($SiO_2$) layer;
the plurality of first conductive regions comprise a polysilicon or metal layer;
the plurality of second dielectric regions comprise a second Silicon Oxide ($SiO_2$) layer;
the third dielectric regions comprises a third Silicon Oxide ($SiO_2$) layer or a Silicon in Oxynitride (SiON) layer; and
the fourth dielectric region comprises an Oxide or Spin-on-Glass (SOG) layer.

6. The IC according to claim 2, wherein the plurality of MTJ cell pillars comprise:
  a reference magnetic layer coupled to a plurality of selectors;
  a tunneling barrier layer disposed on the reference magnetic layer; and
  a free magnetic layer disposed on the tunneling barrier layer.

7. The IC according to claim 6, wherein the plurality of MTJ cell pillars further comprise one or more seed layers, one or more Synthetic Antiferromagnetic (SAF) layers, one or more anti-ferromagnetic (AFM) coupling layers, one or more ferromagnetic (FM) coupling layers, one or more Processional Spin Current (PSC) coupling layers, one or more Perpendicular Magnetic Anisotropy (PMA) layers, one or more capping layers, and/or one or more hard mask layers.

8. The IC according to claim 6, wherein the reference magnetic barrier layer is coupled to the plurality of semiconductor materials with various degree of crystallinity regions by a plurality of second silicide regions.

9. The IC according to claim 6, further comprises a plurality of contacts coupled to the free magnetic layer through a plurality of second silicide regions.

10. The IC according to claim 9, wherein a second silicide region comprises one of a Nickel Silicide (NiSi), Cobalt Silicide ($CoSi_2$), or Titanium Silicide ($TiSi_2$).

11. The IC according to claim 2, wherein the plurality of second conductive regions are coupled together by a respective source line for a memory cell array.

12. The IC according to claim 2, wherein the plurality of second conductive regions are patterned to form top contacts on respective MTJ cell pillars.

13. The IC according to claim 2, wherein the plurality of second conductive regions comprise at least a portion of a plurality of bit lines for a memory cell array.

14. The IC according to claim 1, wherein the plurality of first silicide regions are buried below a top surface of the substrate.

15. The IC according to claim 1, wherein the plurality of first silicide regions approximate a top surface of the substrate.

16. The IC according to claim 1, further comprising a nitride layer disposed between the plurality of first dielectric regions and both the substrate and the plurality of first silicide regions.

17. The IC according to claim 16, wherein the first dielectric regions comprise Silicon Oxide ($SiO_2$) and the nitride layer comprises Silicon Nitride ($Si_3N_4$).

18. The IC according to claim 1, wherein the plurality of first silicide regions comprise elongated bars with a tight pitch.

19. The IC according to claim 3, wherein the first and second portions of the semiconductor materials with various degree of crystallinity comprise Silicon (Si) doped with phosphorus (P) or Arsenic (As), and the third portions of the semiconductor materials with various degree of crystallinity comprise Silicon (Si) doped with Boron (B) or Aluminum (Al).

20. The IC according to claim 1, wherein the third dielectric region comprises one of a Silicon Oxide ($SiO_2$), Silicon Oxynitride (SiON), Aluminum Oxide ($Al_2O_3$), or Hafnium Oxide ($HfO_2$) with a high-k value.

* * * * *